(12) United States Patent
Hashimoto et al.

(10) Patent No.: US 11,455,038 B2
(45) Date of Patent: Sep. 27, 2022

(54) VIBRATION STRUCTURE, VIBRATION DEVICE, AND TACTILE SENSE PRESENTATION DEVICE

(71) Applicant: Murata Manufacturing Co., Ltd., Nagaokakyo (JP)

(72) Inventors: Junichi Hashimoto, Nagaokakyo (JP); Jun Endo, Nagaokakyo (JP); Kentaro Usui, Nagaokakyo (JP)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 17 days.

(21) Appl. No.: 16/251,423

(22) Filed: Jan. 18, 2019

(65) Prior Publication Data
US 2019/0155391 A1  May 23, 2019

Related U.S. Application Data

(63) Continuation of application No. PCT/JP2018/025885, filed on Jul. 9, 2018.

(30) Foreign Application Priority Data

Jul. 14, 2017 (JP) .............................. JP2017-137643
Dec. 18, 2017 (JP) .............................. JP2017-241398

(51) Int. Cl.
*G06F 3/01* (2006.01)
*G06F 3/041* (2006.01)
(Continued)

(52) U.S. Cl.
CPC ............ *G06F 3/016* (2013.01); *B06B 1/0688* (2013.01); *G06F 3/01* (2013.01); *G06F 3/041* (2013.01);
(Continued)

(58) Field of Classification Search
CPC .......... G06F 3/016; G06F 3/0412; G06F 3/01; G06F 3/041; G06F 3/0414;
(Continued)

(56) References Cited

U.S. PATENT DOCUMENTS 4,511,760 A * 4/1985 Garwin ................. G06F 3/0414
178/18.03
10,598,192 B2 * 3/2020 Bukland ............... F04B 45/047
(Continued)

FOREIGN PATENT DOCUMENTS

JP   H09115378 A   5/1997
JP   2011096183 A  5/2011
(Continued)

OTHER PUBLICATIONS

International Search Report issued for PCT/JP2018/025885, dated Sep. 25, 2018.
(Continued)

*Primary Examiner* — Christopher E Leiby
(74) *Attorney, Agent, or Firm* — ArentFox Schiff LLP

(57) ABSTRACT

A vibration structure that includes a frame member having an opening therein; a vibration part within the opening in the frame member; a support part that connects the vibration part and the frame member and supports the vibration part within the opening in the frame member; a film that deforms in a planar direction in response to voltage application; and a connection member that connects the film to the vibration part and the frame member such that the vibration part vibrates in the planar direction when the film deforms in the planar direction.

18 Claims, 21 Drawing Sheets

(51) Int. Cl.
*H01L 41/09* (2006.01)
*B06B 1/06* (2006.01)

(52) U.S. Cl.
CPC .......... *G06F 3/0412* (2013.01); *G06F 3/0414* (2013.01); *H01L 41/09* (2013.01); *H01L 41/0973* (2013.01); *G06F 2203/014* (2013.01)

(58) Field of Classification Search
CPC ............... G06F 2203/014; H01L 41/09; H01L 41/0973; B06B 1/0688; H02N 1/08
See application file for complete search history.

(56) References Cited

U.S. PATENT DOCUMENTS

| | | | | |
|---|---|---|---|---|
| 2007/0170817 A1* | 7/2007 | Ikeda | ..................... | H01L 41/09 310/323.04 |
| 2007/0296523 A1* | 12/2007 | Yamakawa | ............... | H03H 3/04 333/133 |
| 2011/0074247 A1* | 3/2011 | Hohlfeld | ............... | B81B 3/0051 310/329 |
| 2011/0102343 A1 | 5/2011 | Imai | | |
| 2011/0109195 A1* | 5/2011 | Nakatsuka | ............... | H02N 1/08 310/300 |
| 2013/0266461 A1* | 10/2013 | Hirata | ................... | F04B 43/046 417/413.2 |
| 2015/0071797 A1* | 3/2015 | Takeuchi | ............. | F04B 43/0027 417/413.2 |
| 2015/0227201 A1* | 8/2015 | Nakao | ..................... | G06F 3/041 345/156 |
| 2015/0318462 A1* | 11/2015 | Kim | ........................ | G06F 3/016 310/332 |
| 2016/0204716 A1 | 7/2016 | Suzuki et al. | | |
| 2019/0302948 A1* | 10/2019 | Laitinen | .................. | G06F 3/016 |

FOREIGN PATENT DOCUMENTS

| | | |
|---|---|---|
| JP | 2012137971 A | 7/2012 |
| JP | 2012138514 A | 7/2012 |
| JP | 2016071451 A | 5/2016 |
| WO | 2010035507 A1 | 4/2010 |
| WO | 2013179821 A1 | 12/2013 |
| WO | 2015019919 A1 | 2/2015 |

OTHER PUBLICATIONS

Written Opinion of the International Searching Authority issue for PCT/JP2018/025885, dated Sep. 25, 2018.

* cited by examiner

VIBRATION STRUCTURE, VIBRATION DEVICE, AND TACTILE SENSE PRESENTATION DEVICE

CROSS REFERENCE TO RELATED APPLICATIONS

The present application is a continuation of International application No. PCT/JP2018/025885, filed Jul. 9, 2018, which claims priority to Japanese Patent Application No. 2017-137643, filed Jul. 14, 2017, and Japanese Patent Application No. 2017-241398, filed Dec. 18, 2017, the entire contents of each of which are incorporated herein by reference.

FIELD OF THE INVENTION

The present invention relates to a vibration structure which generates vibrations, a vibration device, and a tactile sense presentation device.

BACKGROUND OF THE INVENTION

In recent years, there has been proposed a tactile sense presentation device that gives tactile feedback on a touch panel by transmitting vibrations when a user touches the touch panel, making the user feel as if he or she "pressed" the touch panel.

For example, Patent Document 1 discloses a configuration having a vibration motor disposed in an end portion of a touch panel to vibrate the entire touch panel by a substantially even amount of vibrations.

Patent Document 1: Japanese Patent Application Laid-Open No. 2012-137971

SUMMARY OF THE INVENTION

However, the vibration motor is relatively thick because a coil is included therein.

Accordingly, it is an object of the present invention to provide a vibration structure, a vibration device, and a tactile sense presentation device which have a smaller thickness than a thickness of a configuration having a vibration motor.

A vibration structure according to an aspect of the present invention includes a frame member that is connected to the film and has having an opening therein; a vibration part that has a smaller area than an area of within the opening in the frame member in plan view, is connected to the film, and vibrates in the plane direction when the film deforms in the plane direction; a support part that connects the vibration part and the frame member and supports the vibration part on within the opening in the frame member; a film that deforms in a planar direction in response to voltage application; and a connection member that connects the film to the vibration part and the frame member such that the vibration part vibrates in the planar direction when the film deforms in the planar direction.

In this vibration structure, the vibration part vibrates in the planar direction in the opening of the frame member, and thus a total thickness only includes a thickness of the film, a thickness of the connection member, and a thickness of the vibration part, and hence is quite thin. Further, the film has elasticity and has shock resistance.

According to the vibration structure described above, a smaller thickness than that of a configuration having a vibration motor can be achieved.

DETAILED DESCRIPTION OF THE INVENTION

Figure 1:
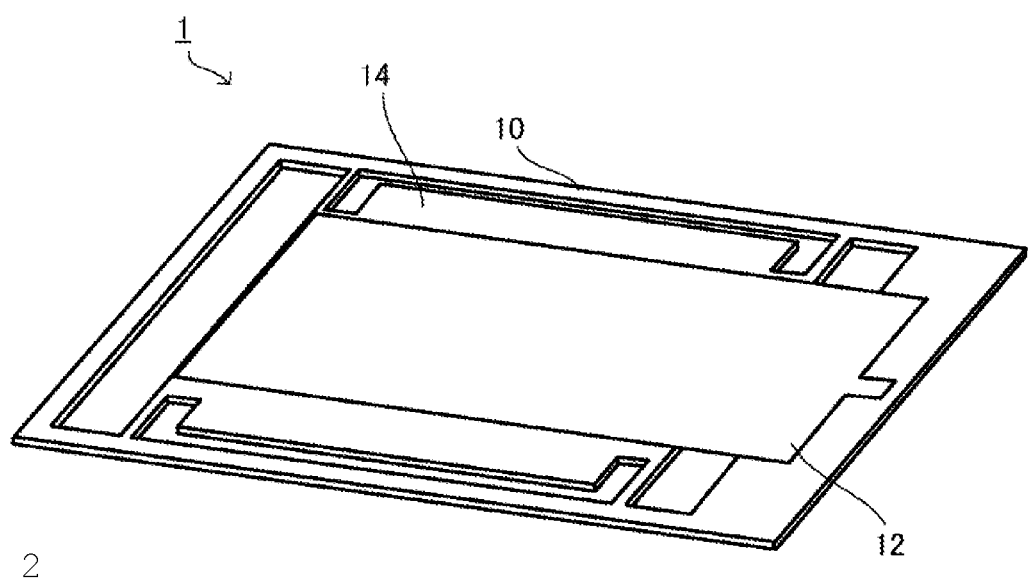
FIG. 1 is a perspective view of a vibration structure 1.
Figure 2:
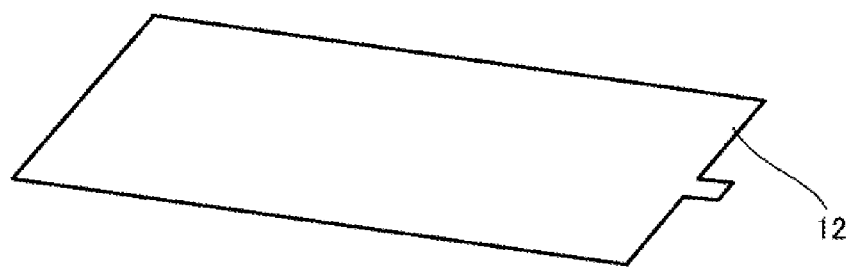
FIG. 2 is an exploded perspective view of the vibration structure 1.
Figure 2:
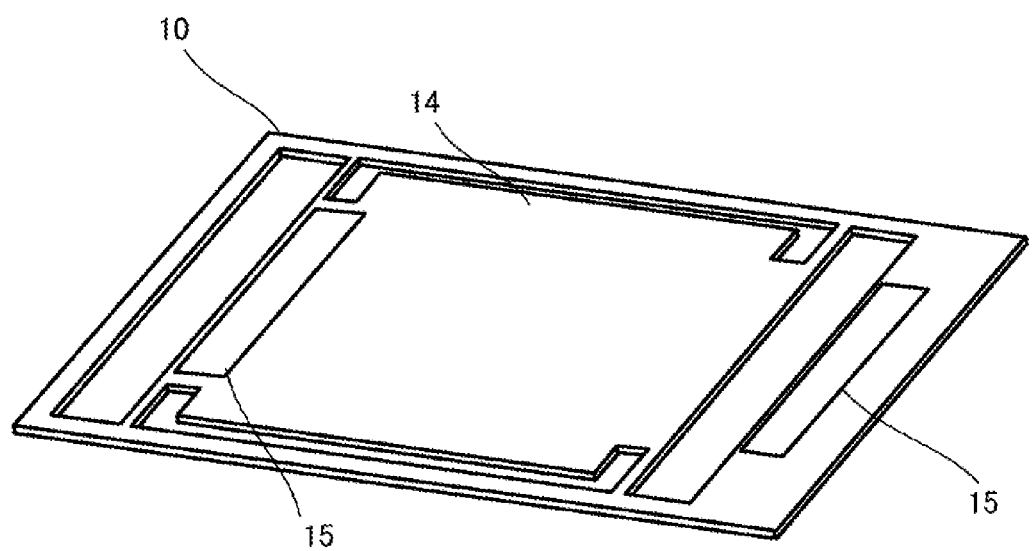
Figure 3A:
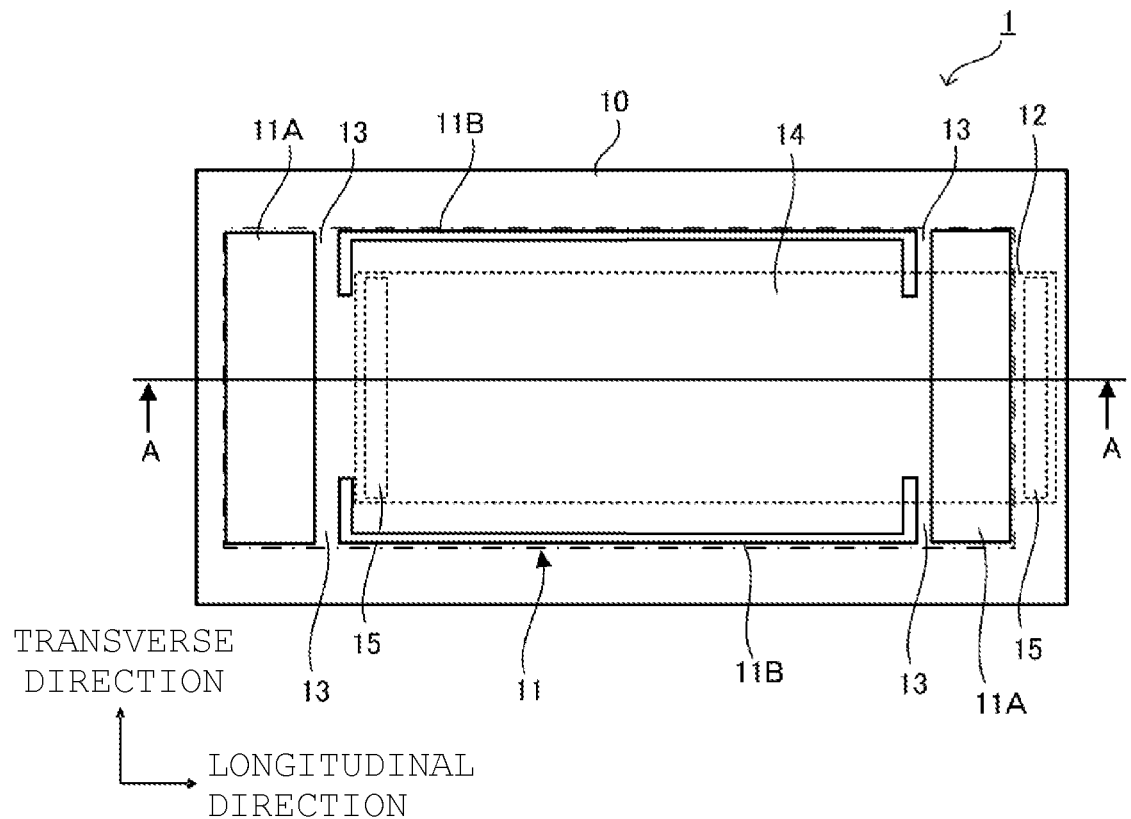
FIG. 3(A) is a plan view of the vibration structure 1.
Figure 3B:
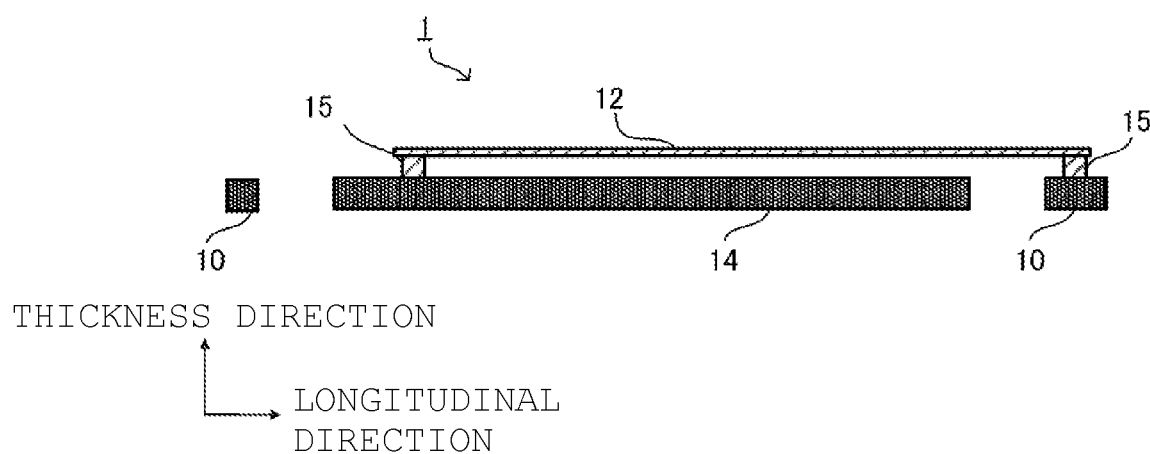
FIG. 3(B) is an A-A cross-sectional view.

FIG. 1 is a perspective view of a vibration structure 1, and FIG. 2 is an exploded perspective view. FIG. 3(A) is a plan view of the vibration structure 1, and FIG. 3(B) is an A-A cross-sectional view.

The vibration structure 1 of the present embodiment includes a frame member 10, a piezoelectric film 12, a support part 13, a vibration part 14, and a connection member 15.

The frame member 10 has a rectangular shape in plan view. The frame member 10 has an opening 11 having a rectangular shape. In this example, the opening 11 is constituted of two first openings 11A disposed on both ends in a longitudinal direction of the frame member 10, and two second openings 11B disposed on both ends in a transverse direction of the frame member 10. The first openings 11A have a rectangular shape that extends along the transverse direction of the frame member 10. The second openings 11B have a rectangular shape that extend along the longitudinal direction of the frame member 10. Further, both ends in a longitudinal direction of the second openings 11B further extend in a rectangular shape toward a center axis (a line A-A in the diagram) of the frame member 10.

The vibration part 14 has a rectangular shape in plan view, and is disposed inside the opening 11. An area of the vibration part 14 is smaller than an area of the opening 11.

The support part 13 connects the vibration part 14 and the frame member 10, and supports the vibration part 14 on the frame member 10. In this example, the support part 13 has a rectangular shape that extends along the transverse direction of the frame member 10, and retains the vibration part 14 at both ends in a longitudinal direction of the vibration part 14. That is, a length of the support part 13 in a direction that is orthogonal to a direction in which the piezoelectric film 12 expands and contracts is larger than a length along the direction in which the piezoelectric film 12 expands and contracts.

In this example, the frame member 10, the vibration part 14, and the support part 13 are formed of a same material (for example, acrylic resin, PET, polycarbonate, glass epoxy, FRP, metal, or glass). That is, the frame member 10, the vibration part 14, and the support part 13 are formed by punching one plate member having a rectangular shape along shapes of the first openings 11A and the second openings 11B. The frame member 10, the vibration part 14, and the support part 13 may be different materials from each other, but can be formed of the same material for ease of manufacture. When being formed of the same material, it is also unnecessary to use another material of rubber or the like (a material that can suffer from a creep deterioration) to support the vibration part 14, and thus the vibration part 14 can be retained stably for a long period. Further, when being formed of the same material and being made by punching, unique vibration periods of a plurality of support parts 13 are exactly the same, and thus it is possible to alleviate variation in vibrations of the vibration part 14 when the vibration part 14 is vibrated. However, in the present invention, these members need not be formed of the same material. For example, when different materials are used for the plurality of support parts 13, movement of the vibration part 14 can be adjusted. For example, when a material having a high elastic coefficient such as rubber is used for the support part 13, the magnitude of voltage to be applied to the piezoelectric film 12 can be made small.

The piezoelectric film 12 is connected to the frame member 10 and the vibration part 14. The piezoelectric film 12 is one example of a film that deforms in a planar direction in response to voltage application. The piezoelectric film 12 has a rectangular shape that extends along the longitudinal direction of the frame member 10 in plan view. The piezoelectric film 12 is formed of, for example, polyvinylidene fluoride (PVDF). Alternatively, the piezoelectric film 12 may be constituted of a chiral polymer. For the chiral polymer, for example, poly-L-lactic acid (PLLA) or poly-D-lactic acid (PDLA) is used.

When PVDF is used for the piezoelectric film 12, because PVDF is resistant to water, an electronic device including a vibration member in this example can be vibrated in a same manner in any humidity environment.

Further, when PLLA is used for the piezoelectric film 12, because PLLA is a material having high transmittance, if electrodes and a vibration part that are added to PLLA are made of transparent materials, the device can be manufactured easily because the internal status of the device can be visually recognized. Further, because PLLA has no pyroelectric property, PLLA can be vibrated similarly in any temperature environment.

If the piezoelectric film 12 is formed of PLLA, the piezoelectric film 12 is given piezoelectricity by cutting so that each outer peripheral side is at approximately 45° to a uniaxial stretching direction of the film.

A first end in a longitudinal direction of the piezoelectric film 12 is connected to a first end in the longitudinal direction of the frame member 10. A second end of the piezoelectric film 12 is connected to a second end in the longitudinal direction of the vibration part 14.

As illustrated in FIG. 3(B), the piezoelectric film 12 is connected to the frame member 10 and the vibration part 14 via the connection member 15. The frame member 10 has a rectangular shape that extends along a transverse direction of the frame member 10 in plan view. The connection member 15 has a certain thickness and connects the piezoelectric film 12 and the vibration part 14 at a certain distance so that the piezoelectric film 12 is not brought into contact with the vibration part 14. Thus, electrodes, which are not illustrated and are provided on both main faces of the piezoelectric film 12 are not brought into contact with the vibration part 14, and thus even when the piezoelectric film 12 expands and contracts to vibrate the vibration part 14, the electrodes will not be damaged. Note that when the frame member 10, the support part 13, and the vibration part 14 are conductive members, it is preferred that an insulating member or a coating film be disposed between the connection member 15 and the frame member 10, the support part 13, and the vibration part 14. In this case, electrical short-circuit can be prevented between the frame member 10, the support part 13, and the vibration part 14 and electrodes of the piezoelectric film 12.

The connection member 15 is formed of, for example, metal, PET, polycarbonate (PC), polyimide, or ABS resin. The connection member 15 connects the piezoelectric film 12 and the vibration part 14 (and the piezoelectric film 12 and the frame member 10) with an adhesive or the like. Note that connecting the connection member 15 and various components via an adhesive or the like is not required. For example, the connection member 15 itself may be an adhesive or a double-sided tape. In this case, it is not necessary to separately prepare an adhesive or the like. The piezoelectric film 12 is connected to the frame member 10 and the vibration part 14 via the connection member 15 in a state that a certain tension is applied to the piezoelectric film 12. However, connecting in a state that a tension is applied to the piezoelectric film 12 is not required. The piezoelectric film 12 may be connected in a manner that a tension is applied only when undergoing contraction.

The piezoelectric film 12 deforms in a planar direction (i.e., in a longitudinal direction) in response to voltage application. By expansion and contraction of the piezoelectric film 12 in a longitudinal direction, the vibration part 14 vibrates in a longitudinal direction as well.

Figure 4A:
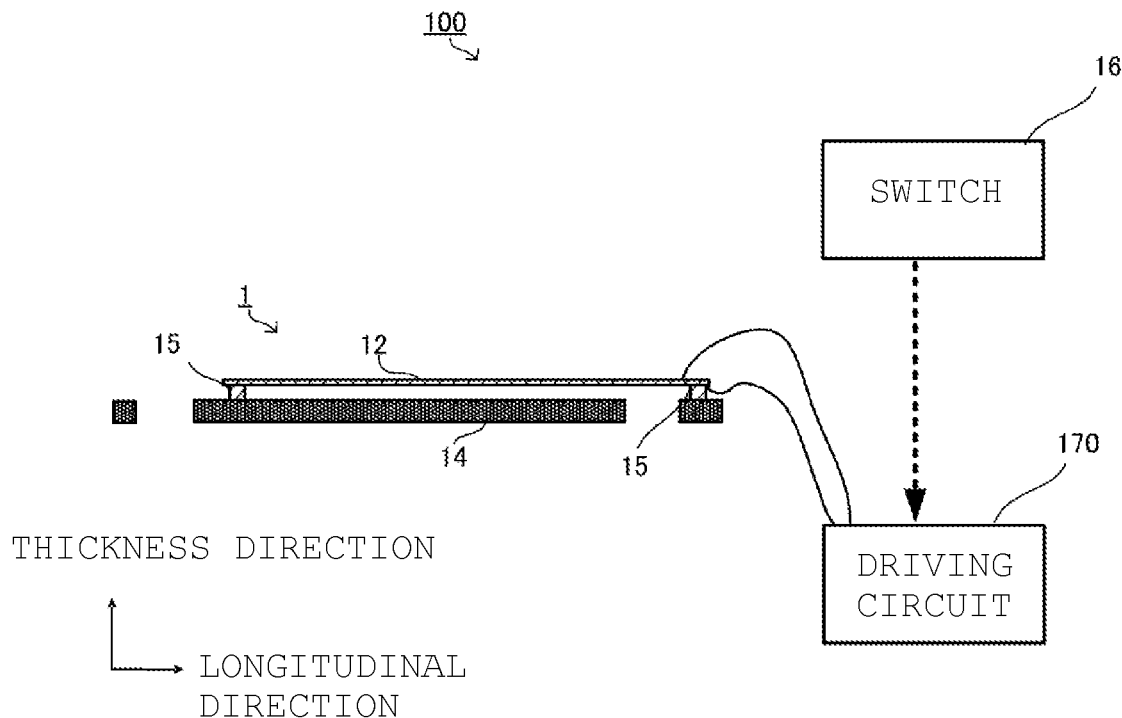
FIG. 4(A) is a schematic view illustrating a configuration of a vibration device 100.
Figure 4B:
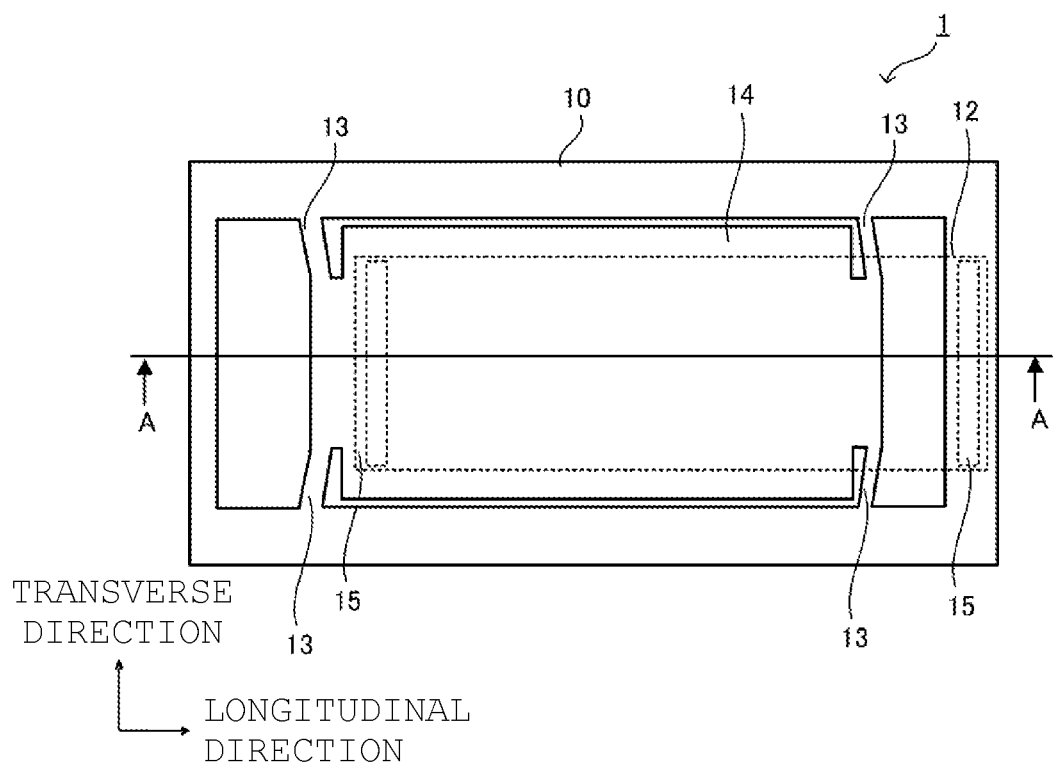
FIG. 4(B) is a plan view of the vibration structure 1.

FIG. 4(A) is a schematic view illustrating a configuration of a vibration device 100 including a driving circuit 170 of the piezoelectric film 12. FIG. 4(B) is a plan view of the vibration structure 1. When a user operates an operator such as a switch 16, the driving circuit 170 applies a voltage to the piezoelectric film 12 to make the piezoelectric film 12 expand and contract.

The piezoelectric film 12 has planar electrodes formed on both main faces. The driving circuit 170 makes the piezoelectric film 12 expand and contract by applying a voltage to the planar electrodes. For example, when the driving circuit 170 applies a negative voltage to the piezoelectric film 12 and the piezoelectric film 12 contracts, as illustrated in FIG. 4(B), the vibration part 14 displaces in a longitudinal direction (rightward direction in the diagram). Because the connection member 15 is very thin, the connection member 15 transmits force with almost no deformation. Accordingly, when the piezoelectric film 12 contracts, the vibration part 14 displaces easily.

Further, when the driving circuit 170 applies a positive voltage to the piezoelectric film 12, the piezoelectric film 12 expands. However, when the piezoelectric film 12 expands, only the piezoelectric film 12 bends and it is difficult to displace the vibration part 14. Accordingly, the driving circuit 170 mainly applies a negative voltage to the piezoelectric film 12 to make the piezoelectric film 12 expand and contract, so as to make the vibration part 14 vibrate. Note that when the piezoelectric film 12 is connected in a state of being applied a tension, the support part 13 which is bent by an initial tension attempts to return to an original form when the piezoelectric film 12 expands, and the vibration part 14 displaces.

Application of a voltage as described above is repeated. That is, the driving circuit 170 applies AC voltages. A driving waveform may be any waveform, such as a rectangular wave, a triangular wave, or a trapezoidal wave. For example, when a sine wave is applied, unnecessary vibrations can be reduced, and sound generated by the unnecessary vibrations can be reduced.

In the vibration structure 1 as described above, the vibration part 14 vibrates in a planar direction inside the opening 11 of the frame member 10. Therefore, a total thickness of the vibration structure 1 only includes, as illustrated in FIG. 3(B), a thickness of the piezoelectric film 12, a thickness of the connection member 15, and a thickness of the vibration part 14 plate, and hence is quite thin. Further, the piezoelectric film 12 has elasticity, and has shock resistance. Furthermore, for the frame member 10, the vibration part 14, and the support part 13, when one plate member having a rectangular shape is constituted of a same member, it is unnecessary to use another member such as a rubber (a member that can suffer from a creep deterioration) for supporting the vibration part 14. Therefore, with the structure of the vibration structure 1, vibrations can be performed stably for a long period.

Figure 5A:
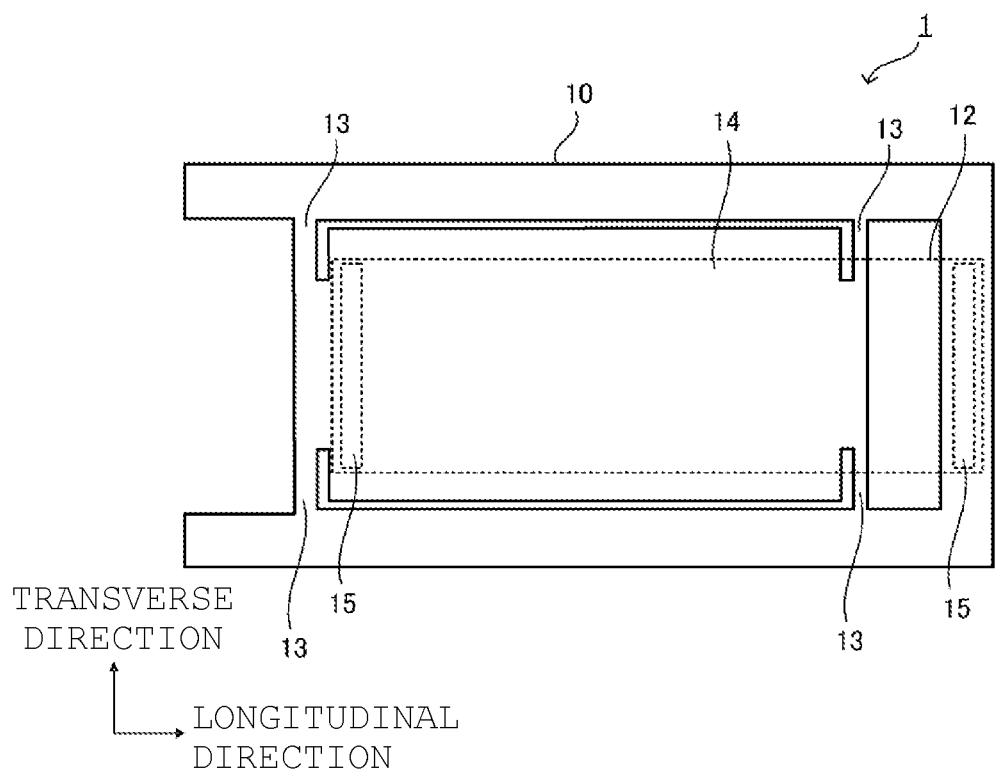
FIG. 5(A) and FIG. 5(B) are views illustrating a modification example of a support part 13.

Note that the shape of the vibration part 14 is not limited to the shape illustrated in FIG. 3(A). For example, as illustrated in FIG. 5(A), the frame member 10 does not need to have an annular shape that surrounds the entire periphery in plan view, and may have a structure with a partial opening as illustrated in FIG. 5(A). Further, the frame member 10 and the vibration part 14 do not need to have a rectangular shape in plan view. The frame member 10 and the vibration part 14 may have a polygonal shape, a circular shape, or an elliptic shape.

Note that although the piezoelectric film 12 can have large amplitude by being connected by the connection member 15 on both ends in a longitudinal direction, being connected by the connection member 15 on both the ends in the longitudinal direction is not required. Further, the longitudinal direction of the piezoelectric film 12 does not need to be along a vibration direction of the vibration part 14. Further, in the example illustrated in FIG. 3(A), although the piezoelectric film 12 covers the vibration part 14 in plan view, for example, it suffices that only a first end (right end in the diagram) of the vibration part 14 and the first end of the frame member 10 are connected.

Figure 5B:
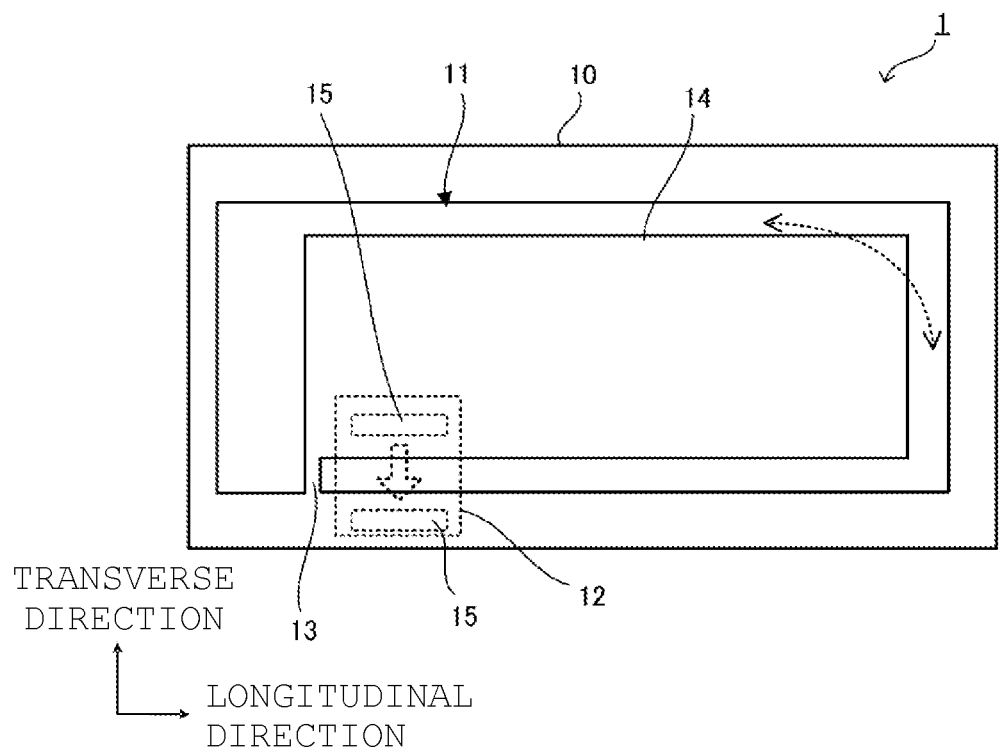

Further, as illustrated in FIG. 5(B), the support part 13 just needs to support the vibration part 14 at least at one position. Particularly in the example of FIG. 5(B), by just connecting the piezoelectric film 12 near the support part 13, the vibration part 14 is rotary vibrated.

Further, the piezoelectric film 12 is not limited to one film. The vibration structure 1 may have a plurality of piezoelectric films 12. In this case, the plurality of piezoelectric films 12 can be driven separately from each other. Further, the plurality of piezoelectric films 12 may have a laminated structure. In this case, an application voltage may be applied to each layer of the plurality of piezoelectric films 12.

Figure 6:
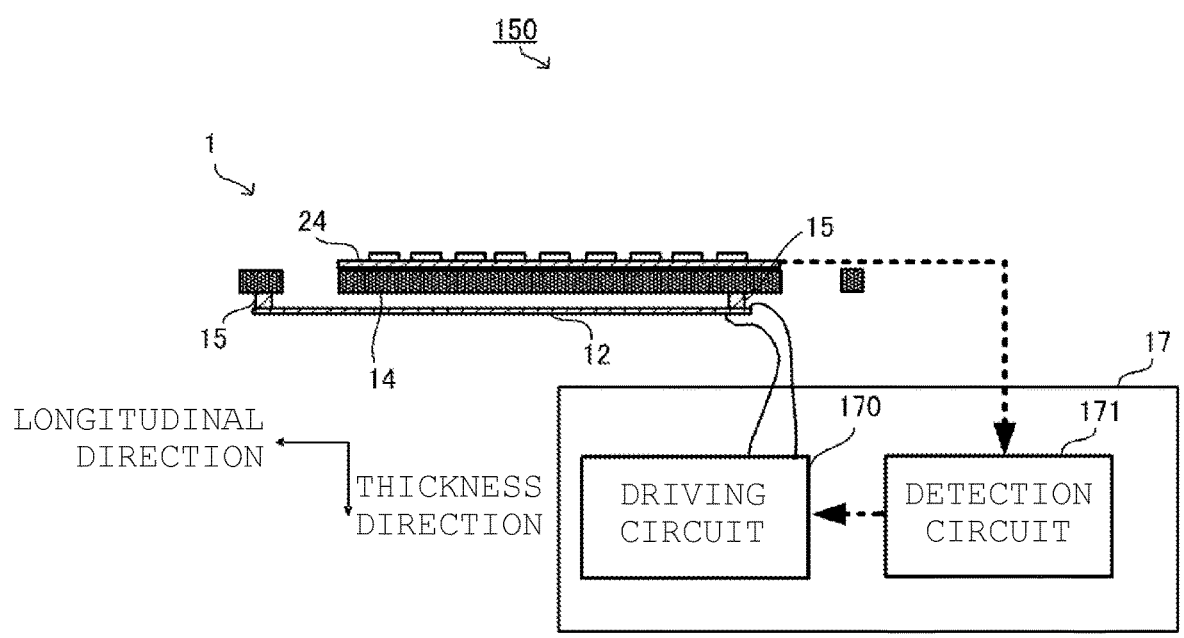
FIG. 6 is a schematic diagram illustrating a configuration of a tactile sense presentation device 150 including a touch sensor 24.

Next, FIG. 6 is a schematic diagram illustrating a configuration of a tactile sense presentation device 150. The tactile sense presentation device 150 further includes a touch sensor 24, in addition to the vibration structure 1 described above. The touch sensor 24 is a sensor in sheet form, and is connected to a main face of the vibration part 14. The touch sensor 24 and the piezoelectric film 12 are connected to a circuit 17. The circuit 17 includes a driving circuit 170 and a detection circuit 171. The touch sensor 24 and the detection circuit 171 constitute a touch detection part.

The touch sensor 24 is provided at a position corresponding to a keyboard layout for example, and detects a touch operation by a user. Incidentally, the touch sensor 24 may employ any method as long as it has a function to detect a touch operation by a user, and various methods can be used, such as a membrane method, an electrostatic capacitance method, or a piezoelectric film method.

When a user touches the vibration part 14, the detection circuit 171 detects a touch operation by the user via the touch sensor 24. When the detection circuit 171 detects a touch operation, the driving circuit 170 applies a driving signal to the piezoelectric film 12, so as to vibrate the vibration part 14. Thus, when the user presses the vibration part 14, the vibration part 14 vibrates, and thus the user can feel a "press" of a key.

Figure 7A:
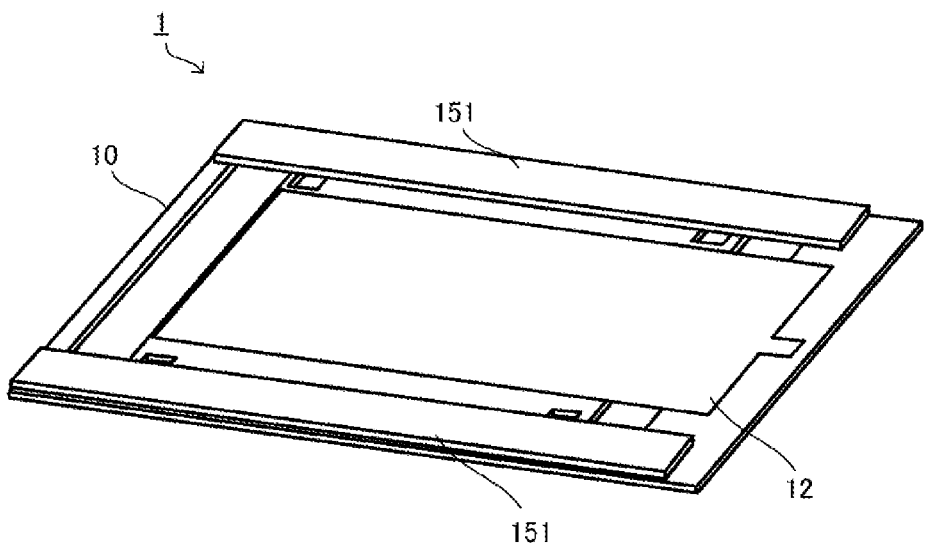
FIG. 7(A) is a perspective view of a case that a guide plate 151 is further added to the vibration structure 1.
Figure 7B:
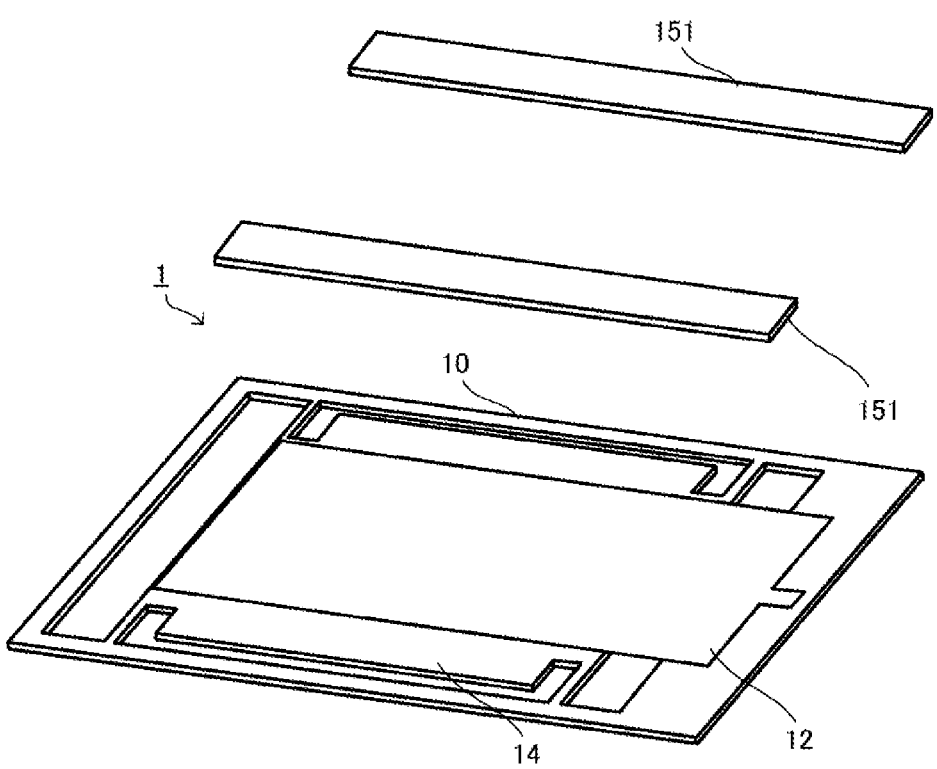
FIG. 7(B) is an exploded perspective view.

Next, FIG. 7(A) is a perspective view of a case that a guide plate 151 is added to the vibration structure 1, and FIG. 7(B) is an exploded perspective view.

The guide plate 151 is a thin plate having a rectangular shape that extends along the longitudinal direction of the frame member 10 in plan view. The thickness of the guide plate 151 is not particularly limited, but for example, the thickness is approximately the same as the combined thickness of the piezoelectric film 12 and the connection member 15.

The guide plate 151 is connected to both ends in the transverse direction of the frame member 10. The guide plate 151 and the frame member 10 are connected with, for example, an adhesive. Further, the guide plate 151 is in contact with both ends in the transverse direction on a main face of the vibration part 14. The guide plate 151 and the vibration part 14 are merely in contact with each other and are not connected. Further, the guide plate 151 covers the support part 13 in plan view. Also the guide plate 151 and the support part 13 are merely in contact with each other and are not connected.

Therefore, when the user presses the vibration part 14, the main face of the vibration part 14 (and the support part 13) and a main face of the guide plate 151 slide with respect to each other.

Because the support part 13 has a small width, when the user presses the vibration part 14, it is possible that the support part 13 also bends in a normal direction, making it difficult to transmit vibrations of the vibration part 14 to the finger. However, in the example of FIG. 7(A) and FIG. 7(B), the guide plate 151 suppresses bending in the normal direction of the support part 13, and vibrations of the vibration part 14 can be easily transmitted to the finger.

Note that although all positions of the guide plate 151 and the vibration part 14 (or the support part 13) that overlap in plan view may be in contact with each other, for example, it is also possible to provide the guide plate 151, the vibration part 14, or the support part 13 with a projecting part, making a contact area small and suppressing a friction coefficient.

Figure 8A:
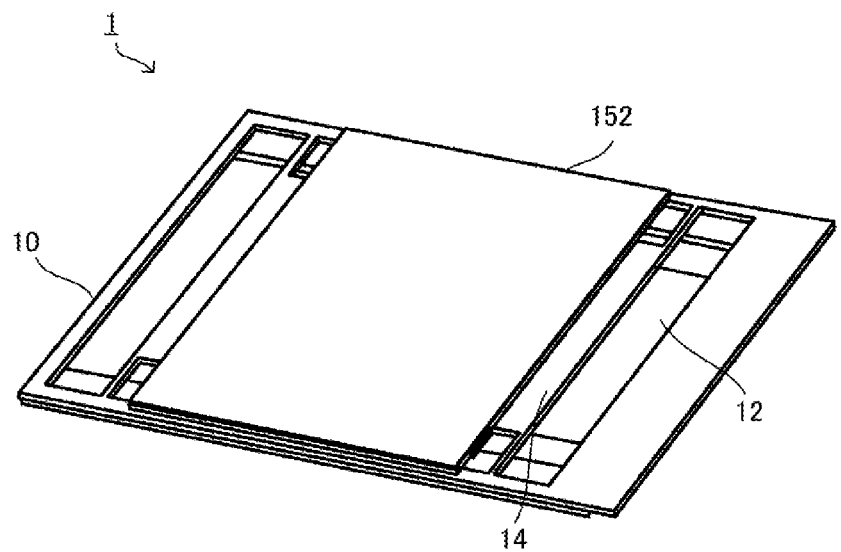
FIG. 8(A) is a perspective view of a case that a guide plate 152 is further added to the vibration structure 1.
Figure 8B:
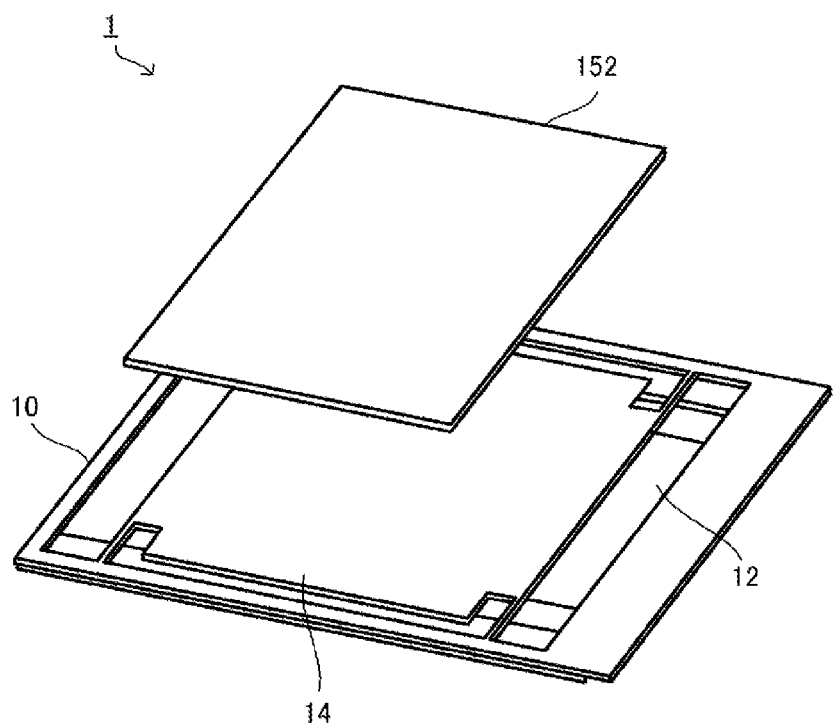
FIG. 8(B) is an exploded perspective view.

FIG. 8(A) is a perspective view of a case that a guide plate 152 is added to the vibration structure 1, and FIG. 8(B) is an exploded perspective view.

The guide plate 152 has a length in a longitudinal direction that is approximately the same as that of the guide plate 151, but has a length in a transverse direction that is approximately the same as that of the frame member 10 in the transverse direction. Further, the guide plate 152 is connected to the vibration part 14. The guide plate 152 is merely in contact with the frame member 10 and the support part 13 but is not connected thereto.

In this case, the guide plate 152 vibrates together with vibrations of the vibration part 14. Both ends of the guide plate 152 and both the ends in the transverse direction of the frame member 10 slide with each other. Also in the example of FIG. 8(A) and FIG. 8(B), the guide plate 152 suppresses bending of the connection member 15 in the normal direction, and does not hinder vibrations of the vibration part 14.

Also in this case, it is possible to provide the guide plate 152, the frame member 10, or the c support part 13 with a projecting part, making a contact area small, and suppressing a friction coefficient.

Figure 9A:
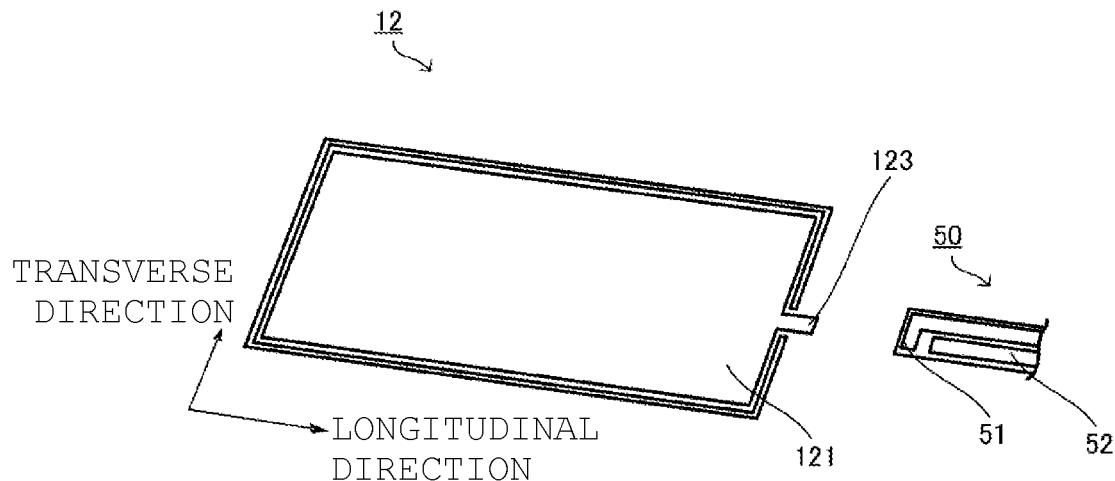
FIG. 9(A) is a perspective view illustrating a connecting position between a piezoelectric film 12 and a flexible cable 50.
Figure 9B:
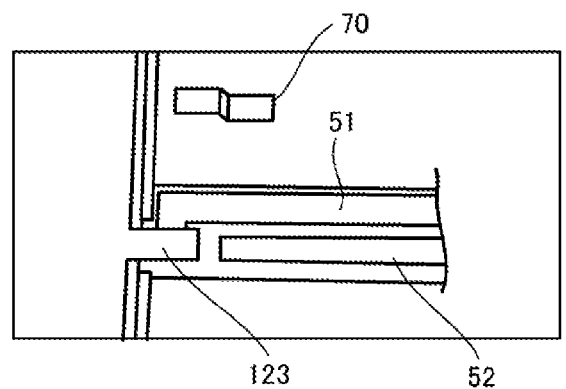
FIG. 9(B) and FIG. 9(C) are enlarged perspective views.
Figure 9C:
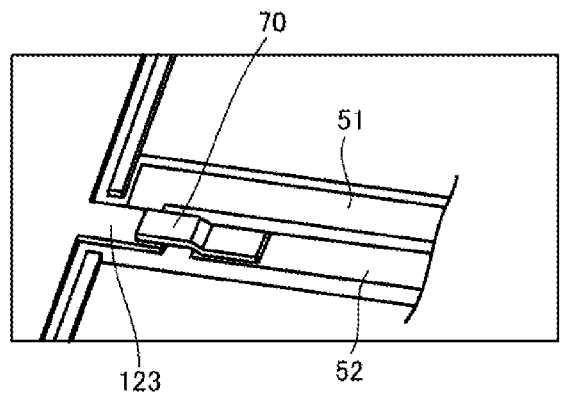

Next, FIG. 9(A) is a perspective view illustrating a connecting position between the piezoelectric film 12 and a flexible cable 50, and FIG. 9(B) and FIG. 9(C) are enlarged perspective views.

The flexible cable 50 has a first electrode 51 having an L shape in plan view, and a second electrode 52 having a rectangular shape in plan view. The first electrode 51 is longer in a longitudinal direction than the second electrode 52.

The piezoelectric film 12 includes a first electrode 121 on a first main face, and a second electrode that is not illustrated on a second main face that is not illustrated. Further, the piezoelectric film 12 includes an electrode extended part 123. The electrode extended part 123 has a shape formed by extending a portion of the piezoelectric film 12 in a longitudinal direction.

The first electrode 51 has a position bent in an L shape that is connected to a rear face side (a second electrode that is not illustrated) of the electrode extended part 123 of the piezoelectric film 12. The second electrode 52 does not reach the electrode extended part 123 of the piezoelectric film 12, but is connected to the first electrode 121 via a conductive tape 70.

Thus, the flexible cable 50 is a thin cable having electrodes formed only on one side can be connected to both electrodes formed on main faces of the piezoelectric film. Therefore, it is possible to reduce the thickness of the vibration device.

Further, the electrodes of the piezoelectric film 12 are partially removed along an outer periphery. Therefore, it is possible to prevent a short circuit when the electrode extended part 123 is connected to the flexible cable 50.

Figure 10A:
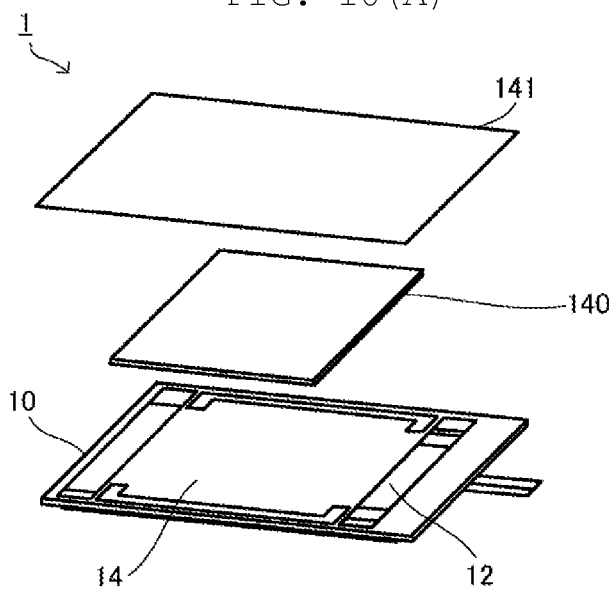
FIG. 10(A) is an exploded perspective view illustrating a configuration in which a spacer 140 and an upper plate 141 are connected above a vibration part 14.

Next, FIG. 10(A) is an exploded perspective view illustrating a configuration in which a spacer 140 and an upper plate 141 are connected above the vibration part 14. The spacer 140 has an area that covers the vibration part 14 in plan view. The upper plate 141 has an area that covers the frame member 10.

The upper plate 141 is connected to the vibration part 14 with the spacer 140 interposed therebetween. The upper plate 141 is not connected to the frame member 10 and the support part 13, but merely in contact therewith. Therefore, the upper plate 141 vibrates in a planar direction together with vibrations of the vibration part 14.

Figure 10B:
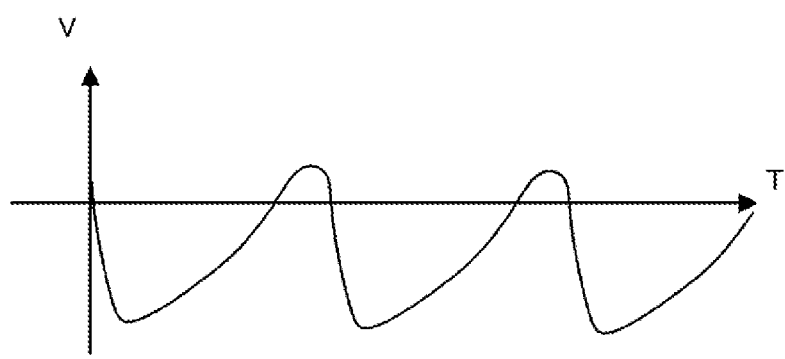
FIG. 10(B) is a diagram illustrating a waveform of a driving signal.

FIG. 10(B) is a diagram illustrating a waveform of a driving signal. As illustrated in FIG. 10(B), the driving signal has a waveform that reaches a peak in short time when a negative voltage is applied, and thereafter gradually increases in voltage.

In this case, the upper plate 141 displaces rapidly in a direction in which the piezoelectric film 12 contracts, but displaces gradually when the piezoelectric film 12 returns to its original state.

Figure 10C:
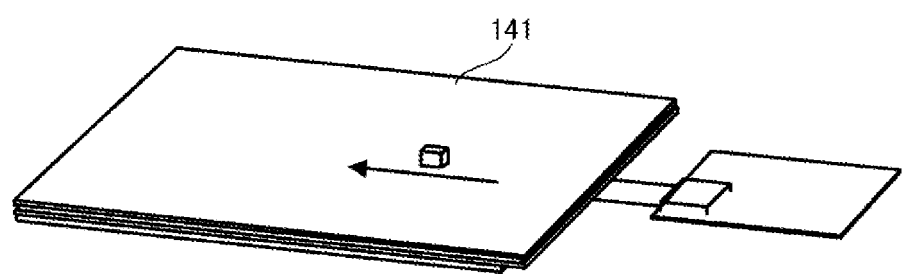
FIG. 10(C) is a perspective view.

Therefore, as illustrated in a perspective view of FIG. 10(C), the vibration device can move an object placed on the upper plate 141 in one direction. In this case, the vibration device can be used as, for example, a transportation device of a small part. Alternatively, when the upper plate 141 is a touch panel, it is possible to move dust or a water drop or the like on the touch panel, so as to remove it. Further, when the spacer 140 or the upper plate 141 includes a vibrationproof material, it is possible to reduce sound generated by bending vibrations of the vibration part 14.

Note that even without the spacer 140 and the upper plate 141, by the waveform of the driving signal illustrated in FIG. 10(B), an object placed on the vibration part 14 can be moved in one direction. Therefore, the waveform illustrated in FIG. 10(B) can be applied to all the examples described above.

Figure 11:
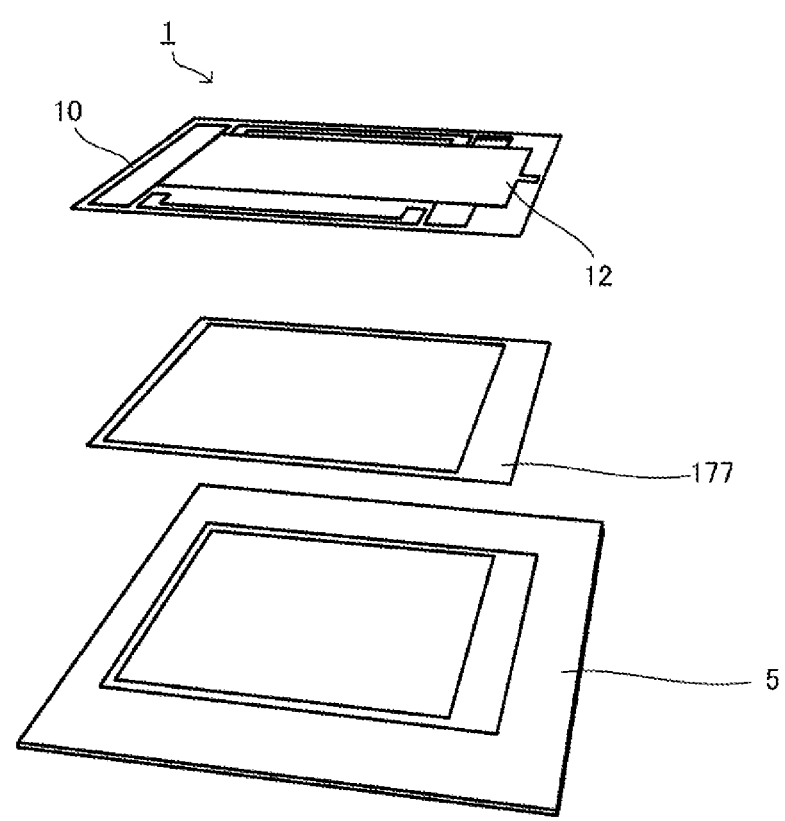
FIG. 11 is a diagram illustrating a vibration structure including a second vibration part 5.

Next, FIG. 11 is a diagram illustrating a vibration structure including a second vibration part 5. In this example, the frame member 10 is connected to the second vibration part 5 with a spacer 177 interposed therebetween. It is desired that for the spacer 177, a relatively hard material be used for reliably transmitting vibrations of the vibration part 14 to the second vibration part 5. However, the spacer 177 may also be a double-sided tape having certain hardness or an adhesive.

Figure 12A:
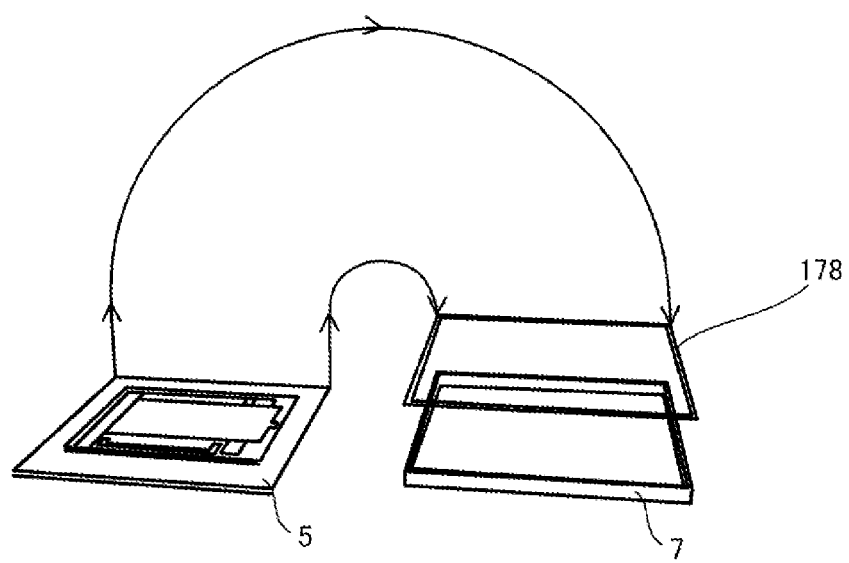
FIG. 12(A) is a perspective view illustrating a connection state of a case 7 and the second vibration part 5.

The second vibration part 5 is connected to a case 7 having a box shape with a cushion 178 as one example of an elastic body interposed therebetween, as illustrated in FIG. 12(A). The cushion 178 is constituted of a material that is relatively soft so as not to hinder movement of the second vibration part 5. The case 7 is, for example, a case of an information processing device such as a smartphone. In this case, the second vibration part 5 serves as a surface panel.

Figure 12B:
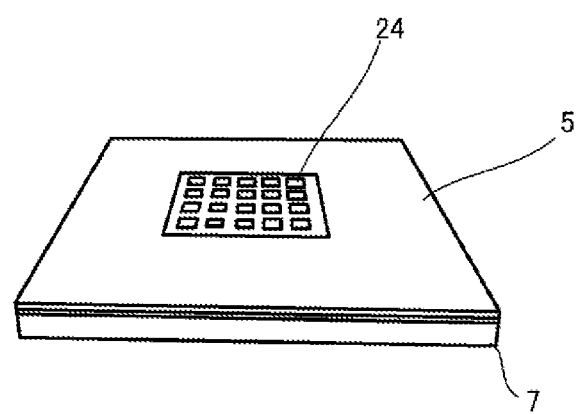
FIG. 12(B) is a perspective view after connection.

In this case, the touch sensor 24 is disposed on a surface of the second vibration part 5, as illustrated in FIG. 12(B).

As illustrated in FIG. 6, the touch sensor 24 and the piezoelectric film 12 are connected to the circuit 17. When the user presses the touch sensor 24 provided on the second vibration part 5 with a finger, a voltage is applied to the piezoelectric film 12 to make it expand and contract, and the vibration part 14 vibrates. The second vibration part 5 is neither connected to nor in contact with the vibration part 14. However, when the vibration part 14 vibrates, the second vibration part 5 vibrates in an opposite phase by reaction of the vibration part 14. Therefore, also in the example illustrated in FIG. 11, FIG. 12(A), and FIG. 12(B), vibrations can be transmitted to the user via the second vibration part 5.

In any of the examples before FIG. 10, the user touches the vibration part 14 as a source of vibrations or an object connected to the vibration part 14, it is possible that the vibrations are damped. However, in the example illustrated in FIG. 11, FIG. 12(A), and FIG. 12(B), the user does not directly touch the vibration part 14, and thus the vibrations of the vibration part 14 will not be damped. Therefore, even when the user firmly presses the second vibration part 5, the state of vibrations of the vibration part 14 does not change largely. Thus, in the example illustrated in FIG. 11, FIG. 12(A), and FIG. 12(B), vibrations can be stably transmitted to the user. Further, when the volume of the case 7 is increased, or rubber legs are attached to a bottom face of the case 7 so as to make it less susceptible to vibration than the second vibration part 5, the second vibration part 5 can vibrate stably, and force transmitted to the finger can be increased.

Figure 13:
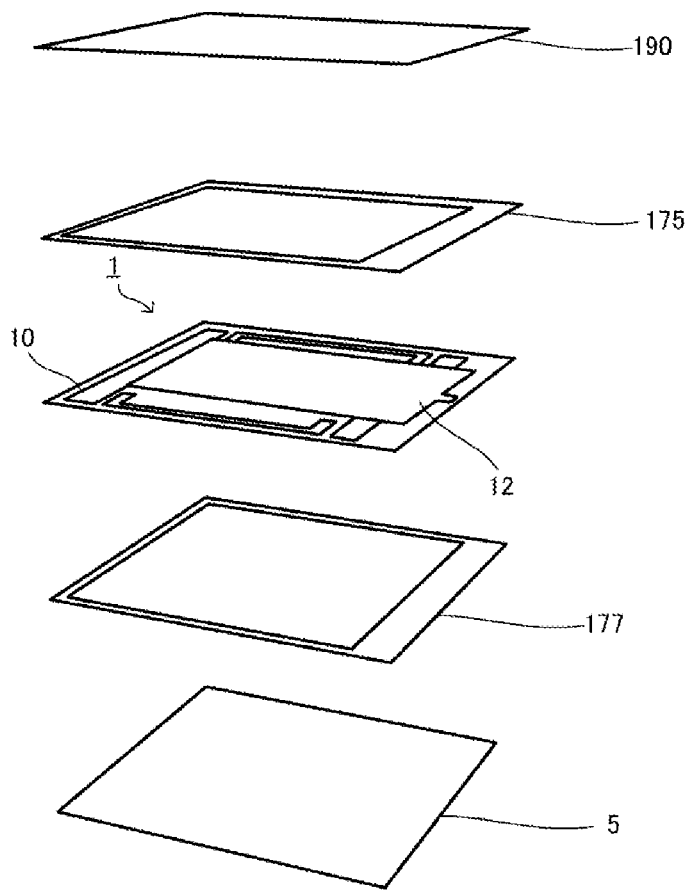
FIG. 13 is an exploded perspective view of a case that a soundproof sheet 190 is connected to the vibration structure 1.

Next, FIG. 13 is an exploded perspective view of a case that a soundproof sheet 190 is connected to the vibration structure 1.

In the frame member 10 of the vibration structure 1, on a main face where the piezoelectric film 12 is disposed, a soundproof sheet 190 is attached with a spacer 175 interposed therebetween.

When the mass of the vibration part 14 (or the second vibration part 5) is m, force F transmitted to the user as vibrations is F=m·a, and depends on acceleration a of the vibration part 14 (or the second vibration part 5). The acceleration a of the vibration part 14 (or the second vibration part 5) is represented by $a=A\cdot\omega^2$ when an AC voltage ($V=A\cdot\sin\omega t$) is applied to the piezoelectric film 12. Therefore, force F transmitted to the user as vibrations is $F=m\cdot A\cdot\omega^2$, and the larger the frequency of the driving signal of the piezoelectric film 12, the larger the force transmitted.

However, when the frequency of the driving signal becomes high, sound of minute vibrations can be easily heard, which is unpleasant to the user. Accordingly, in the example of FIG. 13, the soundproof sheet 190 is connected to the frame member 10 with the spacer 175 interposed therebetween. The soundproof sheet 190 has an area covering the frame member 10 in plan view. Therefore, sound generated in the vibration part 14 is prevented from reaching the ears of the user.

Incidentally, on the second vibration part 5 side where the soundproof sheet 190 is not provided, sound of the vibration part 14 is blocked by the second vibration part 5. Further, because it is heavier than the vibration part 14, the second vibration part 5 has smaller amplitude than that of the vibration part 14, and sound of vibrations of the second vibration part 5 is not prominent. Further, as illustrated in the example of FIG. 10(C), by attaching the soundproof sheet to the main face of the vibration part 14, the sound can be further reduced.

Figure 14:
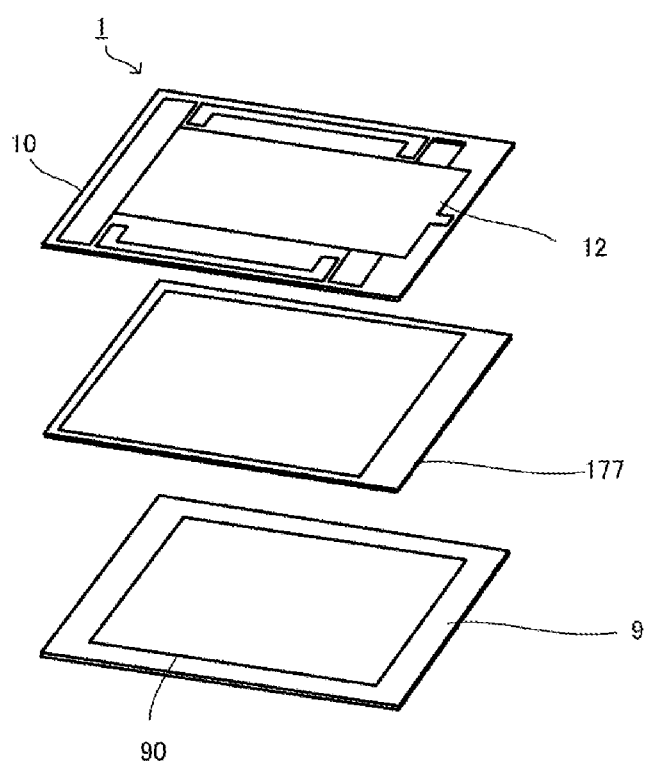
FIG. 14 is an exploded perspective view of a case that a retention bezel 9 of a display is connected to the vibration structure 1.

Next, FIG. 14 is an exploded perspective view of a case that a retention bezel 9 of a display is connected to the vibration structure 1. In this case, the retention bezel 9 serves as the second vibration part. The display has a reflection sheet 90 for backlight.

The frame member 10 is connected to the retention bezel 9 of the display with the spacer 177 interposed therebetween. The retention bezel 9 is an outer periphery retention frame, and sandwiches and fixes the reflection sheet 90 to the display.

In this case, the frame member 10 is not brought into contact with the reflection sheet 90. Therefore, it is possible to connect the vibration structure 1 to a panel that has a member, such as the reflection sheet 90, similarly to the display.

Note that in the present embodiment, the piezoelectric film is presented as one example of a "film that deforms in a planar direction in response to voltage application", but the "film that deforms in a planar direction in response to voltage application" is not limited to the piezoelectric film. Other examples of the "film that deforms in a planar direction in response to voltage application" include an electrostrictive film, an electret film, a composite film, or an electroactive polymer film. Incidentally, the electroactive film is a film that generates stress, or generates a displacement by deforming, by electrical driving. Specifically, there is an electrostrictive film, a composite material (a material produced by sealing a piezoelectric ceramic with resin), an electrically driven type elastomer, a liquid crystal elastomer, or the like. Moreover, a piezoelectric ceramic that has thinness to an extent that does not break is included in the "film that deforms in a planar direction in response to voltage application".

Further, in the present embodiment, although an example of connecting the piezoelectric film 12 to the vibration part 14 and the frame member 10 via the connection member 15 is described, the piezoelectric film 12 may be connected to another resin film that has no piezoelectricity and is connected to the connection member 15.

Of course, a film such as an electrostrictive film, an electret film, a composite film, or an electroactive polymer film may be attached to a main face of a resin film having an end connected to the connection member 15.

Figure 15A:
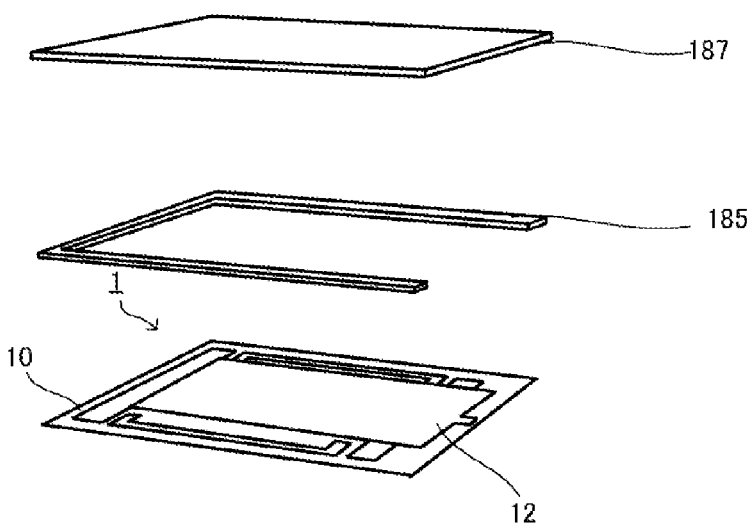
FIG. 15(A) is an exploded perspective view illustrating a modification example when the vibration structure 1 is connected to a flat plate 187 such as a touch panel.
Figure 15B:
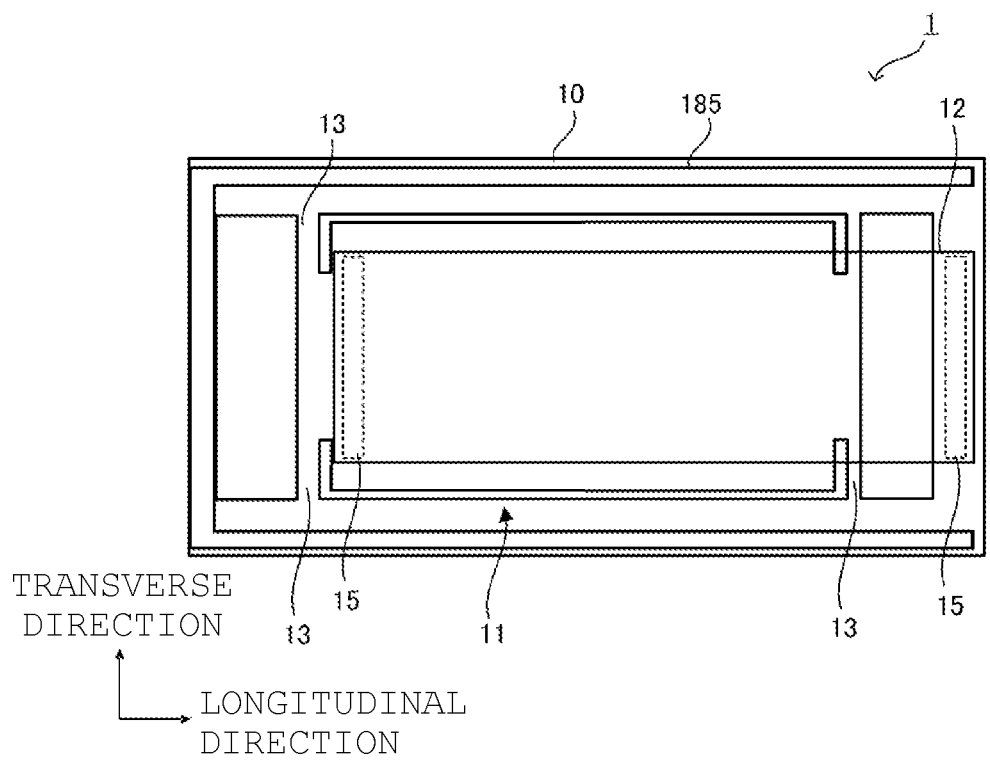
FIG. 15(B) is a plan view.

FIG. 15(A) is an exploded perspective view illustrating a modification example when the vibration structure 1 is connected to a flat plate 187 (a second vibration part 5) such as a touch panel, and FIG. 15(B) is a plan view. The flat plate 187 is, for example, a touch panel. The flat plate 187 has an area that covers the frame member 10 in plan view. The flat plate 187 is connected to the frame member 10 with a spacer 185 interposed therebetween.

The spacer 185 is a member having a linear shape that is disposed along an outer periphery of the frame member 10 of the vibration structure 1 in plan view. However, the spacer 185 is not disposed in a position where the piezoelectric film 12 is disposed. Therefore, the spacer 185 is not brought into contact with the piezoelectric film 12. The piezoelectric film 12 is connected to the frame member 10 in a right side of FIG. 15(B) that is a first end in the longitudinal direction, and is also connected to the vibration part 14 in a left side part of FIG. 15(B) that is a second end in the longitudinal direction. When the piezoelectric film 12 contracts, the second end in the longitudinal direction of the vibration part 14 is pulled to the right side, and simultaneously, the first end of the frame member 10 is pulled to the left side. That is, when the vibration part 14 vibrates, the portion of the frame member 10 connected with the piezoelectric film 12 vibrates more largely than a surrounding part. At this time, if the spacer 185 is disposed on the first end of the frame member 10, which is a part where the piezoelectric film 12 is connected, and the spacer 185 and the piezoelectric film 12 are connected, the frame member 10 is fixed to the spacer 185, which hinders vibrations. When vibrations of the part of the frame member 10 where the piezoelectric film 12 is connected are hindered, the user is mainly given tactile feedback equivalent to the amplitude of the vibration part 14 only, and thus vibrations felt by the user are small. However, as illustrated in FIG. 15(A) and FIG. 15(B), by not disposing the spacer 185 in the part where the piezoelectric film 12 is disposed, vibrations of the vibration part 14 and the frame member 10 contribute to tactile feedback, and thus vibrations felt by the user can be increased.

Note that while it suffices that the spacer 185 is not connected to the piezoelectric film 12, the spacer 185 may be disposed in a position where the piezoelectric film 12 is disposed, and may be brought into contact with the piezoelectric film 12. In this case, the piezoelectric film 12 expands and contracts while being in contact with the spacer 185. Also in this case, the influence of hindering vibrations of the frame member 10 is small.

Figure 16A:
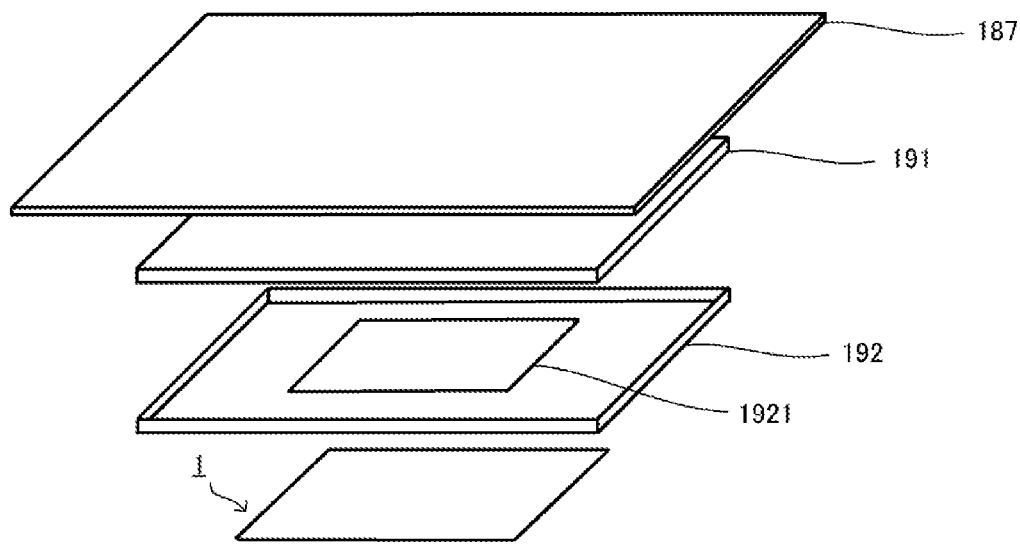
FIG. 16(A) is an exploded perspective view illustrating still another modification example when the vibration structure 1 is attached to the flat plate 187.
Figure 16B:
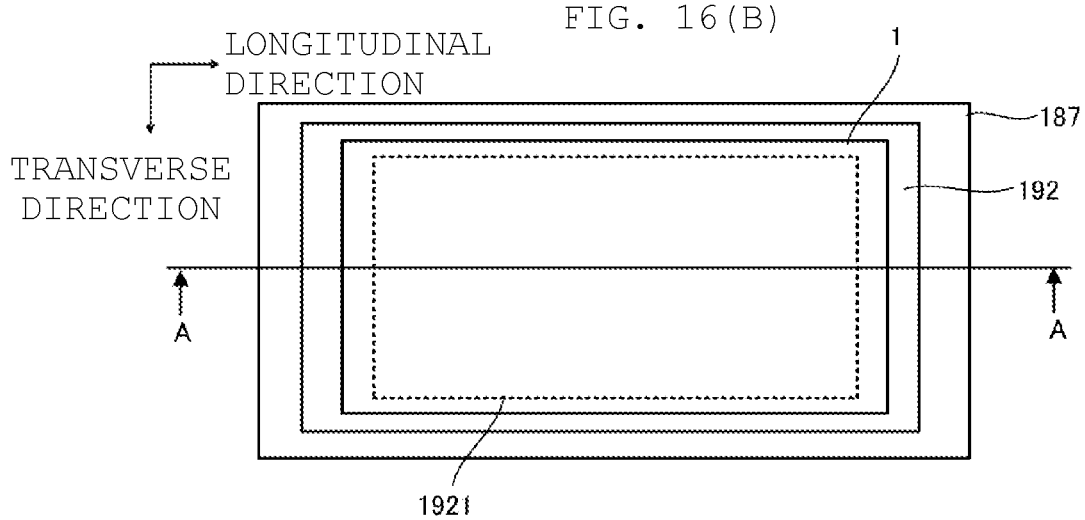
FIG. 16(B) is a bottom view.
Figure 16C:
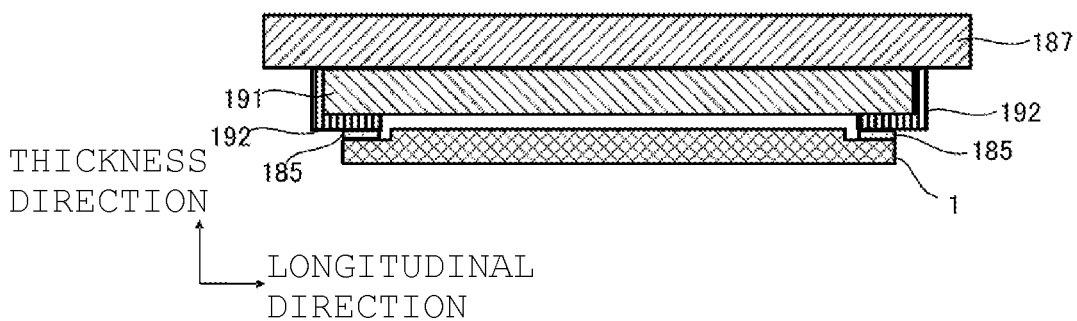
FIG. 16(C) is a cross-sectional view.

Next, FIG. 16(A) is an exploded perspective view illustrating still another modification example when the vibration structure 1 is attached to the flat plate 187, FIG. 16(B) is a bottom view, and FIG. 16(C) is a cross-sectional view. In this example, a display device 191 is fixed to the flat plate 187, which is a touch panel, by a retention frame 192.

The retention frame 192 is a flat plate having a rectangular shape in plan view, and includes walls having a height that is approximately the same as that of the display device 191 on four sides of an outer periphery. The retention frame 192 is connected to the flat plate 187 on upper ends of the walls. Thus, the display device 191 is retained and fixed to the flat plate 187 by the retention frame 192.

The frame member 10 in the vibration structure 1 is connected to a bottom face of the retention frame 192 in an outer peripheral part with the spacer 185 interposed therebetween. In a center position of the retention frame 192 in plan view, an opening 1921 having a rectangular shape is provided. In the opening 1921, the piezoelectric film 12 and the connection member 15 of the vibration structure 1 are fit. Therefore, when the vibration structure 1 is attached to the touch panel, thicknesses of the piezoelectric film 12 and the connection member 15 do not need to be taken into account.

Further, the opening 1921 of the retention frame 192 is covered with the vibration structure 1 in plan view. In the vibration structure 1, when the vibration part 14 and the frame member 10 are at ground potential, noise output from parts of the display device 191 or the like can be shielded.

Figure 17:
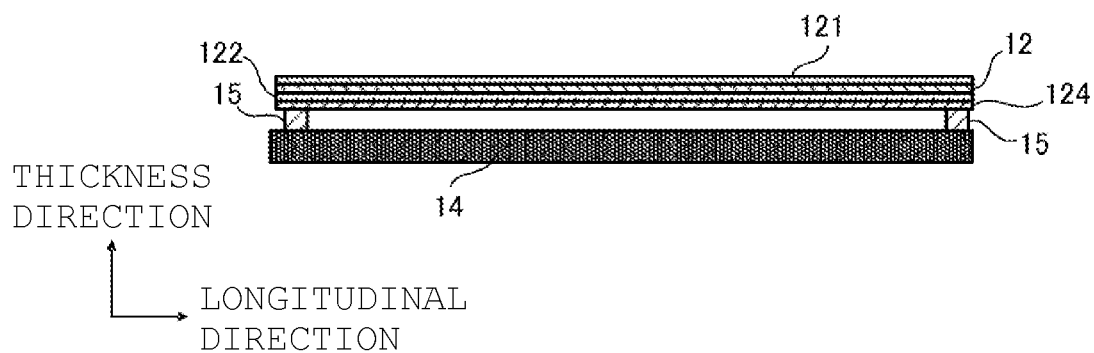
FIG. 17 is a cross-sectional view illustrating a structure of the piezoelectric film 12 in detail.

FIG. 17 is a cross-sectional view illustrating a structure of the piezoelectric film 12 in detail. As illustrated in FIG. 17, the piezoelectric film 12 has the first electrode 121 and the second electrode 122 on both main faces. The driving circuit 170 makes the piezoelectric film 12 expand and contract by applying a voltage to the first electrode 121 and the second electrode 122. For example, when the second electrode 122 is at the ground potential, a displacement of the piezoelectric film 12 is determined by the magnitude of a voltage applied to the first electrode 121. On the other hand, when the driving circuit 170 applies voltages of opposite phases to each other to the first electrode 121 and the second electrode 122, the displacement of the piezoelectric film 12 becomes larger than that when the second electrode 122 is at the ground potential. On the other hand, when the vibration part 14 and the frame member 10 are brought to the ground potential to shield noise output from parts of the display device 191 or the like, potential of the second electrode 122 is in a different state from potential of the vibration part 14 and the frame member 10.

Therefore, in the example of FIG. 17, an insulating body 124 is disposed between the second electrode 122 and the vibration part 14 and the frame member 10, so that the second electrode 122 will not be electrically connected to the members at the ground potential. However, when the second electrode 122 is at the ground potential, the insulating body 124 is not required.

Figure 18A:
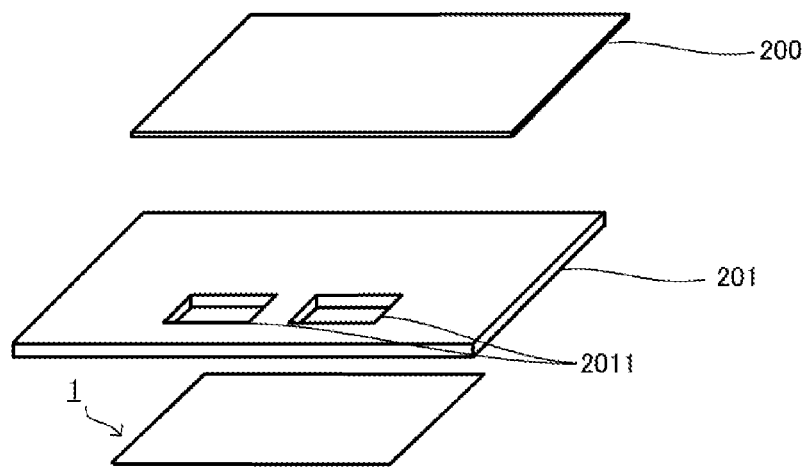
FIG. 18(A) is a perspective view illustrating an example of a case that the vibration structure 1 is attached to a support plate 201 that retains a touch panel.
Figure 18B:
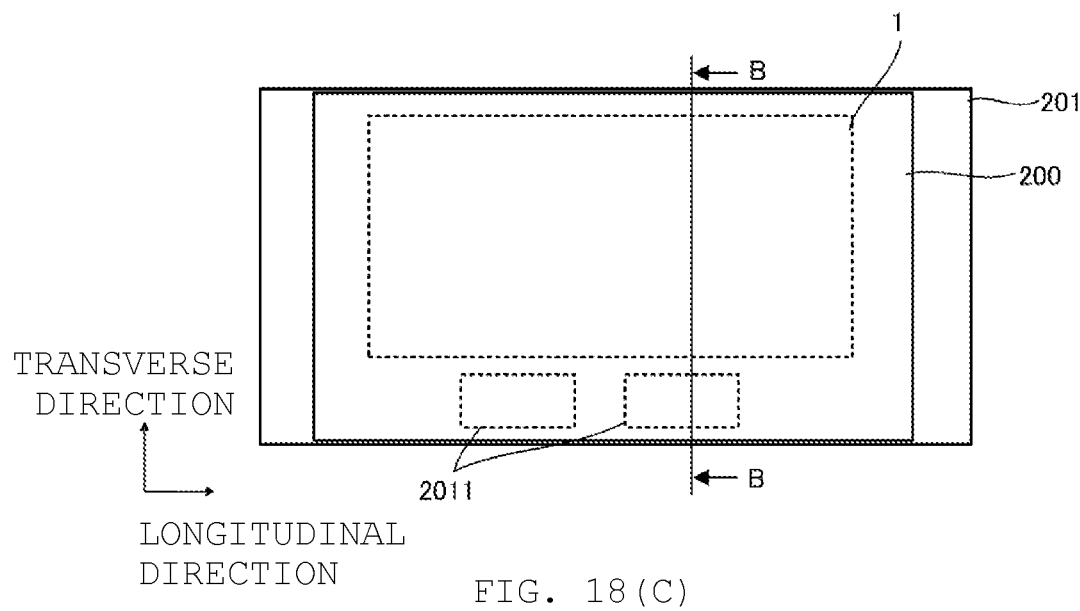
FIG. 18(B) is a plan view.

FIG. 18(A) is an exploded perspective view illustrating an example of a case that the vibration structure is attached to a support plate 201 that retains a touch panel. FIG. 18(B) is a plan view, and FIG. 18(C) is a cross-sectional view (a cross-sectional view taken along a line B-B illustrated in FIG. 18(B)).

Figure 18C:
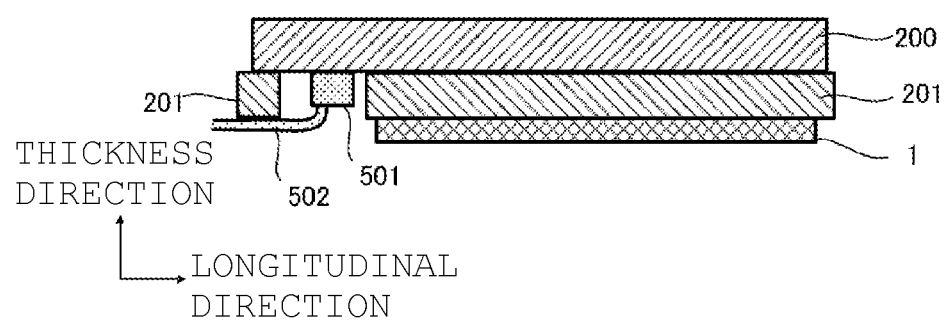
FIG. 18(C) is a cross-sectional view (a cross-sectional view taken along a line B-B illustrated in FIG. 18(B)).

As illustrated in FIG. 18(A), FIG. 18(B), and FIG. 18(C), a touch panel 200 is attached to the support plate 201. The support plate 201 is larger than an area of the touch panel 200 in plan view. The support plate 201 is attached to a case of an information processing device at a position that does not overlap with the touch panel 200 in plan view.

Further, in the support plate 201, one or more (two in this example) openings 2011 are formed. The opening 2011 is disposed at a position where an electronic part 501 of the touch panel 200 is mounted. As illustrated in FIG. 18(C), the electronic part 501 is exposed through the opening 2011. Further, a flexible cable 502 is extended to outside from the opening 2011. Thus, the touch panel 200 can be brought into close contact with the support plate 201.

The vibration structure 1 is disposed at a position that does not overlap with the opening 2011 in plan view. Accordingly, the vibration structure 1 can be disposed in close contact with or in proximity to the support plate 201, which prevents increase in thickness. Further, by not overlapping with the opening 2011, the vibration structure 1 does not hinder working on the electronic part 501 and the flexible cable 502 when there arises a need to repair the touch panel 200.

Figure 19A:
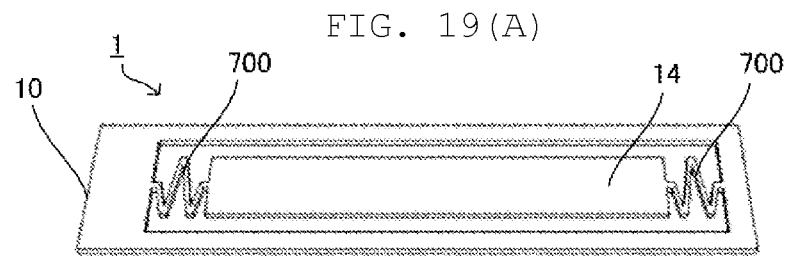
FIG. 19(A) and FIG. 19(B) are perspective views of a vibration part 14 having a spring structure.
Figure 19B:
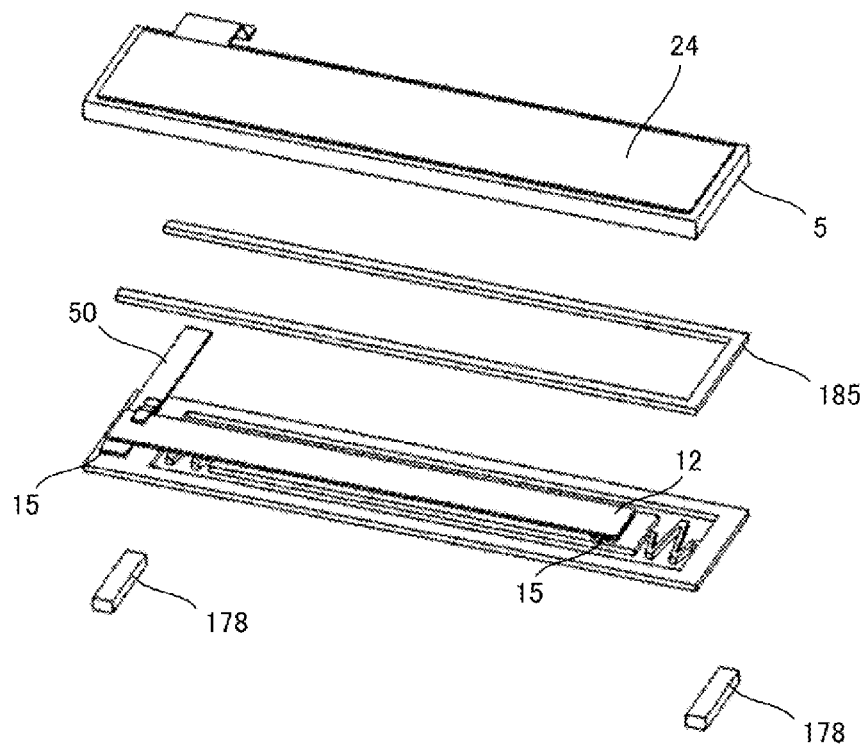
Figure 19C:
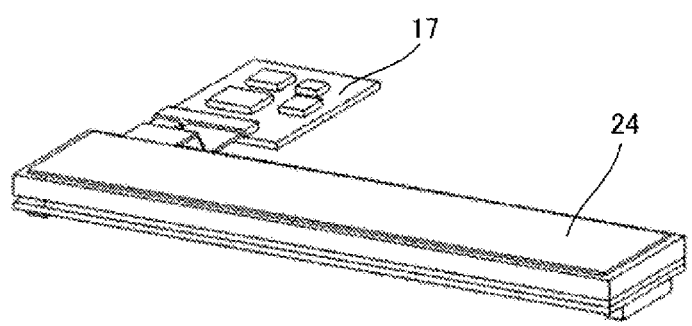
FIG. 19(C) is a perspective view of a case that a driving circuit 170 is connected to a flexible cable 50.

Next, FIG. 19(A) and FIG. 19(B) are perspective views of a first vibration plate having a spring structure, and FIG. 19(C) is a perspective view of a case that a driving circuit is connected to a flexible cable. A vibration structure 1 illustrated in FIG. 19(A) and FIG. 19(B) has a spring structure 700 in a portion of the support part 13. Both ends in a vibration direction of the vibration part 14 are supported on the frame member 10 by the spring structure 700. The spring structure 700 has one thin columnar structure that connects the vibration part 14 and the frame member 10. The spring structure 700 has a portion that is not parallel to a straight line that connects the vibration part 14 and the frame member 10. Further, the vibration structure 1 is formed by integrally forming the vibration part 14, the spring structure

700 (the support part 13), and the frame member 10. Note that although the spring structure 700 is provided at each of both ends in the vibration direction of the vibration part 14 in the examples of FIG. 19(A) and FIG. 19(B), a plurality of the spring structures 700 may further be provided. Further, the spring structure 700 may be provided at one of the ends in the vibration direction of the vibration part 14.

As illustrated in FIG. 19(B), the vibration structure 1 has the piezoelectric film 12 with the connection member 15 interposed. In this example, the connection member 15 is constituted of the flexible cable 50.

To the vibration structure 1, similarly to the example illustrated in FIG. 15(A) and FIG. 15(B), a second vibration part 5 is connected via a spacer 185 that is not connected to the piezoelectric film 12. Further, similarly to the example illustrated in FIG. 12(A) and FIG. 12(B), the second vibration part 5 is connected to the case 7 via cushions 178.

As illustrated in FIG. 19(C), the flexible cable 50 is connected to the circuit 17. Note that although not illustrated, the flexible cable 50 has an electric connection part that is mechanically connected to the circuit 17 and, as in the example illustrated in FIG. 9, is for connecting electrodes on both main faces of the piezoelectric film 12 to the circuit 17.

When the user presses the touch sensor 24 provided on the second vibration part 5 with a finger, a voltage is applied to the piezoelectric film 12 to make it expand and contract, and the vibration part 14 vibrates. When the vibration part 14 vibrates, the second vibration part 5 vibrates in an opposite phase by reaction of the vibration part 14. Therefore, the user can perceive the vibrations via the second vibration part 5.

Note that in the examples illustrated up to FIG. 15, the support part 13 has a rectangular shape that is slender along a direction perpendicular to the vibration direction (hereinafter referred to as a perpendicular direction), and can easily bend in a transverse direction, which is the vibration direction. Therefore, in the examples illustrated up to FIG. 15, the support part 13 can easily support the vibration part 14 in a state of allowing vibration easily. However, in a device that is short in a perpendicular direction (for example, a touch panel disposed on an upper part of a keyboard in plan view), there may be a case that it is difficult to secure a length in the perpendicular direction of the support part 13. However, the spring structure 700 illustrated in FIG. 19(A), FIG. 19(B), and FIG. 19(C) is disposed along the vibration direction, and thus can easily support the vibration part 14 in a state of allowing vibration easily even in a device having a small length in the perpendicular direction.

Further, because the spring structure 700 illustrated in FIG. 19(A), FIG. 19(B), and FIG. 19(C) itself expands and contracts when the vibration part 14 vibrates, the spring structure 700 can retain a state of allowing the vibration part 14 to vibrate easily.

Incidentally, when the spring structure 700 is disposed in each of both ends of the vibration part 14, desirably, the spring structure 700 is disposed on a straight line along the vibration direction to pass the center of gravity of the vibration part 14. In this case, the vibration part 14 can stably vibrate.

Figure 20A:
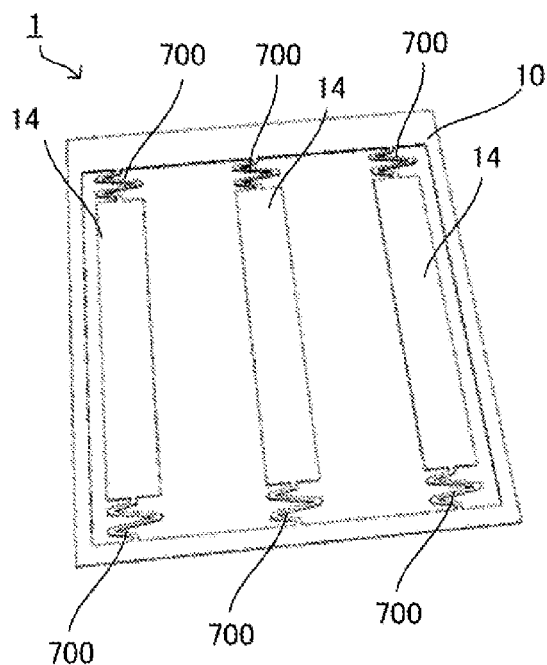
FIG. 20(A) is a perspective view illustrating a vibration structure that can be bent in a direction perpendicular to a vibration direction.

Next, FIG. 20(A) is a perspective view illustrating a vibration structure 1 including a plurality of (three in this example) vibration parts 14. Also in this case, each of the vibration parts 14 can be supported on the frame member 10 by the spring structures 700. Further, the plurality of vibration parts 14, the plurality of spring structures 700 (the support part 13), and the frame member 10 are integrally formed.

Figure 20B:
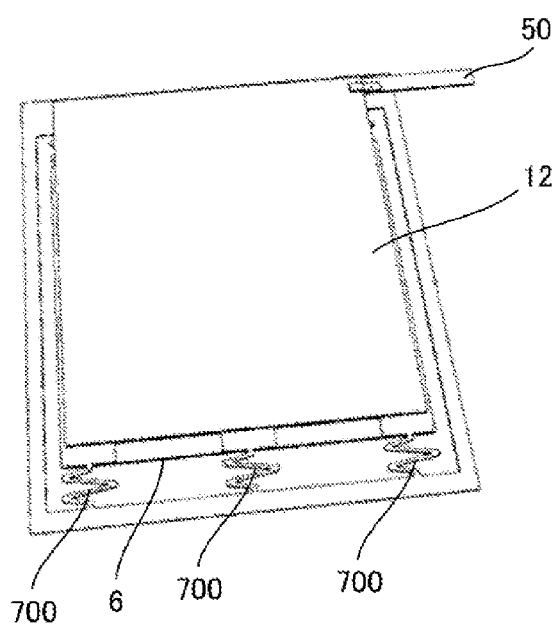
FIG. 20(B) is a perspective view of a case that the piezoelectric film 12 and so on are connected.

As illustrated in FIG. 20(B), main faces on one side of the three vibration parts 14 are connected to each other by a third vibration part 6. The third vibration part 6 has a rectangular shape and has a certain area that covers the three vibration parts 14 in plan view. Main faces on the other side of the three vibration parts 14 are connected with each other by the piezoelectric film 12. The piezoelectric film 12 is connected to the three vibration parts 14 with the connection member 15 interposed therebetween. In this example, a structure including the piezoelectric film 12 is referred to as a vibration structure.

Preferably, the vibration part 14 and the third vibration part 6 are soft members having flexibility. For example, preferably, the vibration part 14 and the third vibration part 6 are a thin metal, a thin resin, a thin glass, or a rubber or the like. Furthermore, when the vibration part 14 and the third vibration part 6 are made of resin or rubber, it is preferred that metal powder be mixed therein to increase density.

Incidentally, although being connected to the different main faces from each other in the example of FIG. 20(B), the third vibration part 6 and the piezoelectric film 12 may be connected to a same main face. For example, the lamination order may be the vibration part 14, the third vibration part 6, and the piezoelectric film 12, or may be the vibration part 14, the piezoelectric film 12, and the third vibration part 6. Further, in the example of FIG. 20(B), the flexible cable 50 also serves as the connection member 15. The flexible cable 50 is connected to the circuit 17. Note that although not illustrated, the flexible cable 50 has an electric connection part that is mechanically connected to the circuit 17 and, as in the example illustrated in FIG. 9, is for connecting electrodes on both main faces of the piezoelectric film 12 to the circuit 17.

Figure 21A:
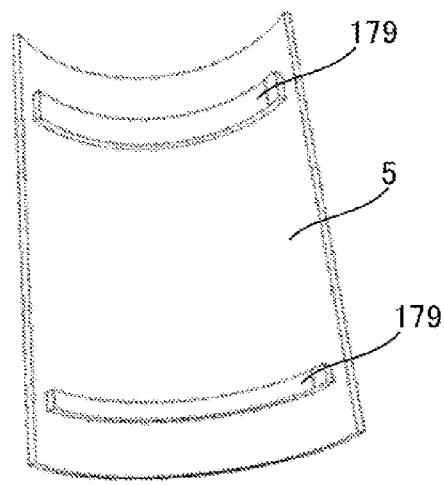
FIG. 21(A) is a rear perspective view of a second vibration part 5.
Figure 21B:
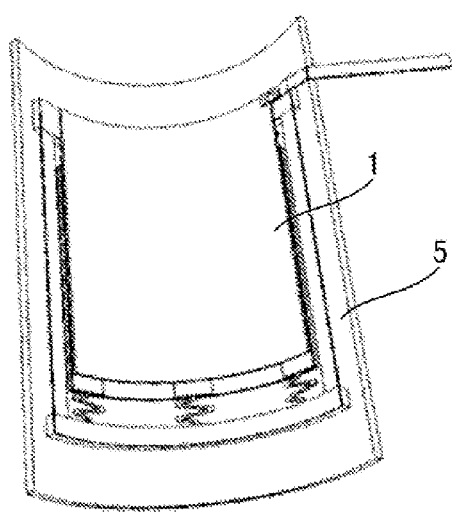
FIG. 21(B) is a rear perspective view of a case that the vibration structure 1 is connected.

FIG. 21(A) is a rear perspective view of the second vibration part 5 having an arc shape. FIG. 21(B) is a rear perspective view of the second vibration part 5 in a state that the vibration structure 1 is connected. The second vibration part 5 connects and fixes the vibration structure 1 to an inner curved face. The second vibration part 5 has a curved shape forming an arc in a direction perpendicular to the vibration direction. An area of the inner curved face is larger than the area of the vibration structure 1. Incidentally, although being an arc in this example, the shape of the curved face may be any curved shape as long as a cross-sectional shape along the vibration direction is even.

As illustrated in FIG. 21(A), to the inner curved face of the second vibration part 5, spacers 179 are connected. The spacer 179 fixes the frame member 10 in the vibration structure 1. The spacer 179 is larger and thicker than the third vibration part 6. Desirably, the spacer 179 is a hard material so as to transmit vibrations easily to the second vibration part 5. The spacer 179 is, for example, a metal, a resin, a glass, or an adhesive. The spacer 179 may be a double-sided tape having certain hardness.

Figure 22A:
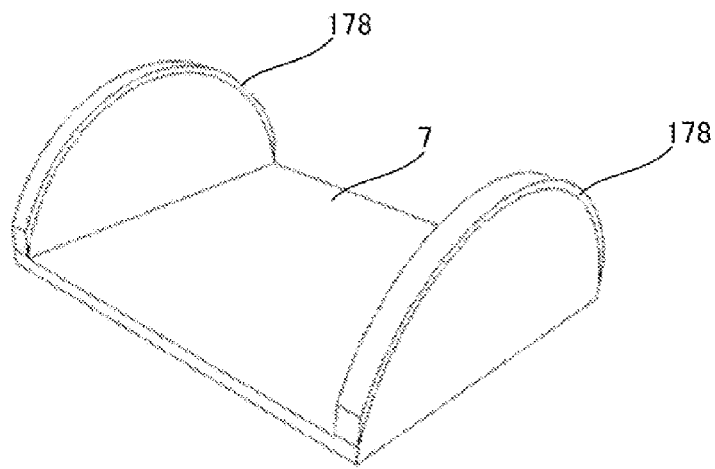
FIG. 22(A) is a perspective view illustrating a case 7 for fixing the second vibration part 5.
Figure 22B:
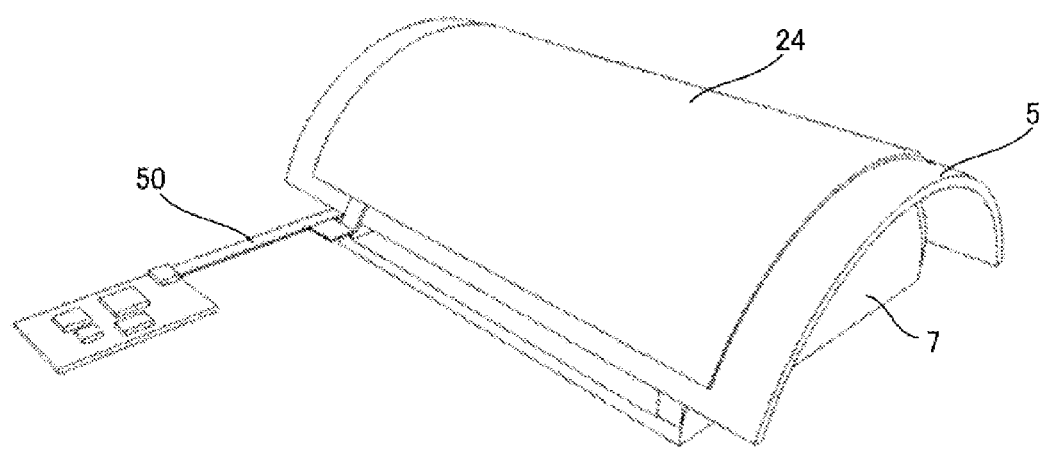
FIG. 22(B) is a perspective view in which the second vibration part 5 is fixed, and the flexible cable 50 is connected to a circuit 17.

FIG. 22(A) is a perspective view illustrating cushions 178 and a case 7 for fixing the second vibration part 5 having an arc shape. An upper face of each cushion 178 has an arc shape along the inner curved face of the second vibration part 5. A lower face of the cushion 178 is flat. That is, the cushion 178 has a semi-columnar shape. The lower face of the cushion 178 is connected to an upper face of the case 7 having a thin rectangular parallelepiped shape. FIG. 22(B) is a perspective view illustrating a state that the second vibration part 5 is connected to the upper faces of the cushions 178, a touch sensor 24 is attached to an outer curved face of the second vibration part 5, and the flexible cable 50 extended from the piezoelectric film 12 and the touch sensor 24 is connected to the circuit 17.

The user presses the touch sensor 24 provided on the second vibration part 5 with a finger. Then, a voltage is applied to the piezoelectric film 12 to make it expand and contract, and the vibration part 14 vibrates. When the vibration part 14 vibrates, the second vibration part 5 vibrates in an opposite phase by reaction of the vibration part 14. Therefore, the user can perceive the vibrations via the second vibration part 5.

Note that in FIG. 22(A), although the rectangular shape is described in the present example, it is not limited to the rectangular shape similarly to the other examples.

The structure illustrated in FIG. 22(A) and FIG. 22(B) can be applied to a curved touch panel or the like. The second vibration part 5 and the touch sensor 24 correspond to a curved touch panel. The vibration structure of the present embodiment can be disposed in a limited space in such a curved touch panel. Further, because the vibration structure of the present embodiment can be bent in a direction perpendicular to the vibration direction, it is possible to wrap around a location where a curved shape changes, such as an arm or an abdomen.

Note that the structure of the support part 13 may be of a rectangular shape that is slender along a direction perpendicular to the vibration direction as illustrated up to FIG. 15, or may be a structure illustrated in FIG. 19(A). In other words, it suffices that the support part 13 has a part not in parallel to the vibration direction.

Figure 23:
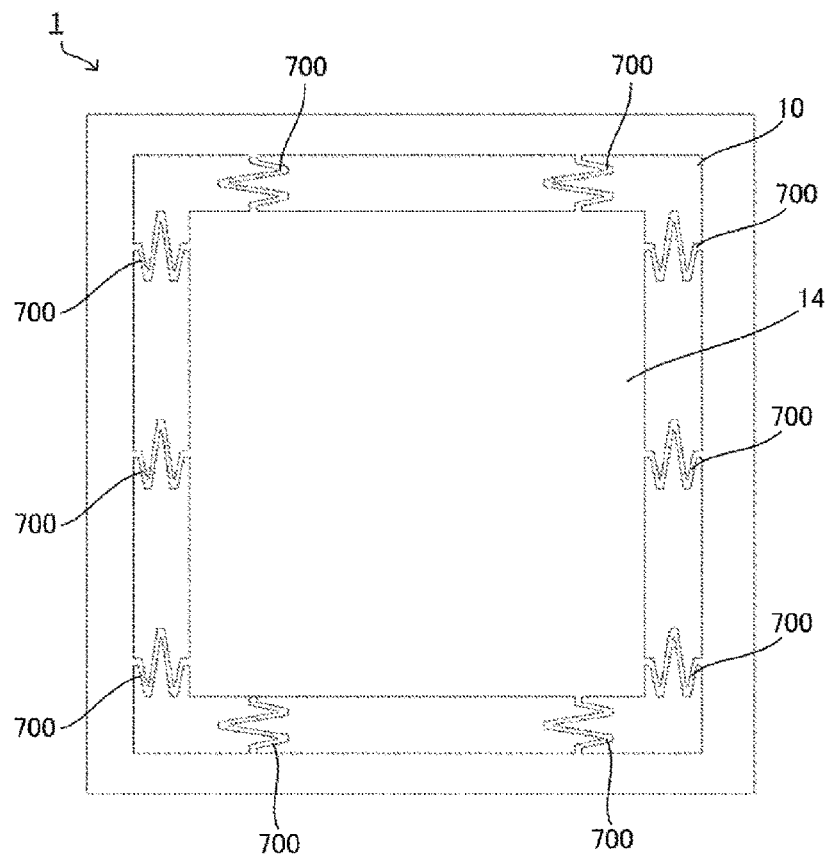
FIG. 23 is a plan view of a vibration structure 1 including a support part 13 (a spring structure 700) in a direction perpendicular to the vibration direction.

In addition, the vibration structure 1 may include the support part 13 (the spring structure 700) also in a direction perpendicular to the vibration direction as illustrated in FIG. 23. In this case, when the vibration structure 1 is bent as illustrated in FIG. 21(B) or FIG. 22(B), the vibration part 14 is also bent along the bend of the frame member 10, and thus the vibration structure 1 can be bent easily.

Figure 24:
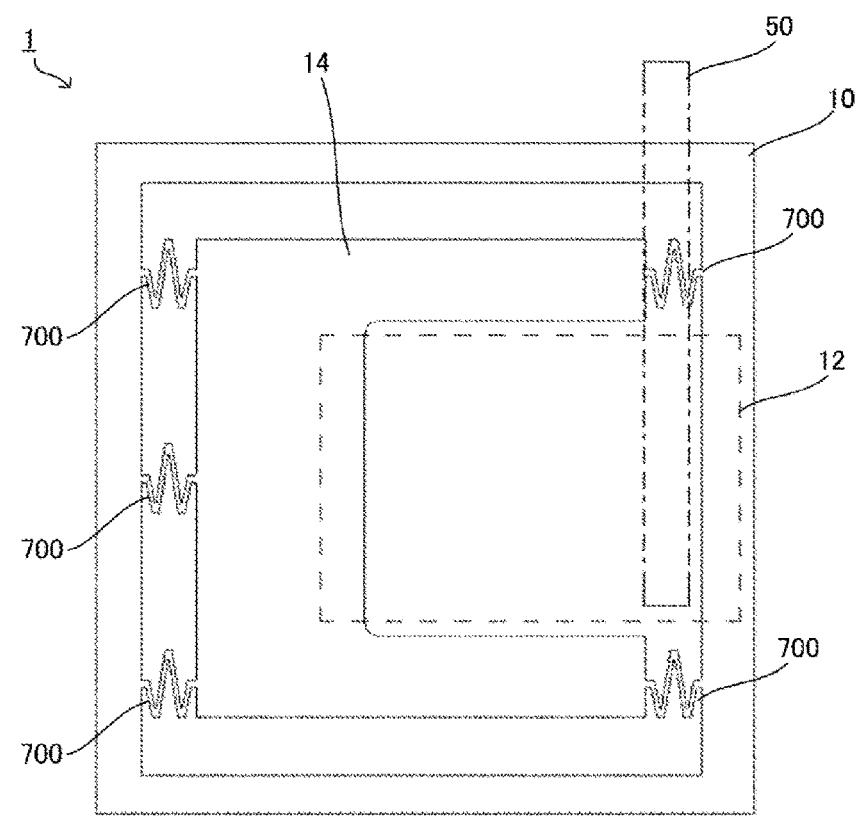
FIG. 24 is a plan view of the vibration structure 1 illustrating a structure in which part of the vibration part 14 is removed.

FIG. 24 is a plan view of the vibration structure 1 illustrating a structure in which part of the vibration part 14 is removed. From the vibration part 14, most parts that overlap with the piezoelectric film 12 in plan view are removed. Further, although not illustrated, in positions of the piezoelectric film 12 that overlap with the vibration part 14, the electrode (the second electrode 122 illustrated in FIG. 17) is removed. Therefore, even without the insulating body 124 as illustrated in FIG. 17, the second electrode 122 of the piezoelectric film 12 and the vibration part 14 will not be connected electrically. Further, it is also not necessary to provide a gap so as to prevent contact of the second electrode 122 of the piezoelectric film 12 and the vibration part 14.

DESCRIPTION OF REFERENCE SYMBOLS

1: vibration structure
5: second vibration part
6: third vibration part
7: case
9: retention bezel
10: frame member
11: opening
11A: first opening
11B: second opening
12: piezoelectric film
13: support part
14: vibration part
15: connection member
151, 152: guide plate
16: switch
17: circuit
170: driving circuit
171: detection circuit
24: touch sensor
50: flexible cable
51: first electrode
52: second electrode
70: conductive tape
90: reflection sheet
100: vibration device
121: first electrode
122: second electrode
123: electrode extended part
124: insulating body
140: spacer
141: upper plate
150: tactile sense presentation device
175: spacer
177, 179, 185: spacer
178: cushion
187: flat plate
190: soundproof sheet
191: display device
192: retention frame
1921: opening
200: touch panel
201: support plate
2011: opening
501: electronic part
502: flexible cable
700: spring structure

The invention claimed is:

1. A vibration structure comprising:
   a frame member having an opening therein;
   a vibration part within the opening in the frame member;
   a support part that connects the vibration part and the frame member and supports the vibration part within the opening in the frame member;
   a film that deforms in a longitudinal direction in response to voltage application; and
   a first connection member that connects the film to the vibration part and a second connection member that directly connects the film to the frame member such that the vibration part vibrates in the longitudinal direction when the film deforms in the longitudinal direction.

2. The vibration structure according to claim 1, wherein the frame member, the vibration part, and the support part are formed of a same material.

3. The vibration structure according to claim 1, wherein the first and second connection members have a thickness sufficient to prevent the film contacting the vibration part.

4. The vibration structure according to claim 1, wherein a length of the support part in a direction orthogonal to the longitudinal direction is larger than a width thereof along the longitudinal direction.

5. The vibration structure according to claim 1, further comprising a guide plate connected to the frame member and constructed to prevent deformation of the frame member in a direction normal thereto.

6. The vibration structure according to claim 5, wherein the vibration part is a first vibration part and the vibration structure further comprises a second vibration part that connected to a main face of the first vibration part and which vibrates together with the first vibration part.

7. The vibration structure according to claim 6, wherein the second vibration part includes a vibrationproof material.

8. The vibration structure according to claim 6, further comprising:
an elastic body; and
a case connected to the second vibration part via the elastic body.

9. The vibration structure according to claim 8, wherein the case is less susceptible to vibration than the second vibration part.

10. The vibration structure according to claim 1, wherein the vibration part is a first vibration part and the vibration structure further comprises a second vibration part that connected to a main face of the first vibration part and which vibrates together with the first vibration part.

11. The vibration structure according to claim 10, wherein the second vibration part includes a vibrationproof material.

12. The vibration structure according to claim 10, further comprising:
an elastic body; and
a case connected to the second vibration part via the elastic body.

13. The vibration structure according to claim 1, further comprising a soundproof sheet that covers the opening in the frame member.

14. The vibration structure according to claim 1, further comprising a display having an outer periphery retention frame, and wherein the frame member is connected to the outer periphery retention frame of the display.

15. The vibration structure according to claim 1, wherein the support part is a spring structure.

16. The vibration structure according to claim 1, wherein the vibration structure is constructed to bend in a direction perpendicular to a vibration direction of the vibration part.

17. A vibration device comprising:
the vibration structure according to claim 1; and
a driving circuit constructed to apply a driving signal to the film.

18. A tactile sense presentation device comprising:
the vibration device according to claim 17; and
a touch detection part that detects a touch operation imparted to the vibration part,
wherein the driving circuit applies a driving signal to the film when the touch detection part detects the touch operation.

* * * * *